United States Patent
Kondo et al.

(10) Patent No.: US 7,078,774 B2
(45) Date of Patent: Jul. 18, 2006

(54) SEMICONDUCTOR MEMORY DEVICE HAVING A SHALLOW TRENCH ISOLATION STRUCTURE

(75) Inventors: Toshiyuki Kondo, Yokkaichi (JP); Katsumasa Hayashi, Yokkaichi (JP); Tomoya Osaki, Yokohama (JP); Seishi Irie, Yokohama (JP)

(73) Assignees: Kabushiki Kaisha Toshiba, Tokyo (JP); Toshiba Microelectronics Corporation, Kawasaki (JP)

(*) Notice: Subject to any disclaimer, the term of this patent is extended or adjusted under 35 U.S.C. 154(b) by 9 days.

(21) Appl. No.: 11/018,817

(22) Filed: Dec. 22, 2004

(65) Prior Publication Data

US 2005/0161719 A1    Jul. 28, 2005

(30) Foreign Application Priority Data

Dec. 25, 2003  (JP)  ............... 2003-431570
Jun. 29, 2004  (JP)  ............... 2004-191448

(51) Int. Cl.
*H01L 29/76* (2006.01)
*G11C 11/34* (2006.01)

(52) U.S. Cl. ............ 257/371; 257/393; 257/904; 365/154

(58) Field of Classification Search ............... 257/371, 257/379, 393, 510, 532, 904; 365/154, 182
See application file for complete search history.

(56) References Cited

U.S. PATENT DOCUMENTS 5,489,790 A * 2/1996 Lage ............... 257/330
5,677,866 A   10/1997 Kinoshita
6,130,470 A * 10/2000 Selcuk ............ 257/534

FOREIGN PATENT DOCUMENTS

JP      10-79440      3/1998

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A semiconductor memory device includes a cell array having matrix-like arrayed plural SRAMs on a semiconductor substrate having an N-well and P-well. The N-well and the P-well are isolated from each other with an isolation region each having a shallow trench structure. Each memory cell includes two CMOS inverter circuits having input and output nodes making a cross-coupled connection. First and second capacitors are connected between each gate node of two CMOS inverter circuits and the N-well and/or N-well.

20 Claims, 19 Drawing Sheets

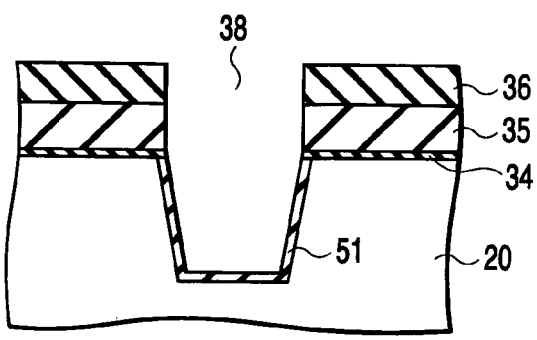
F I G. 7A
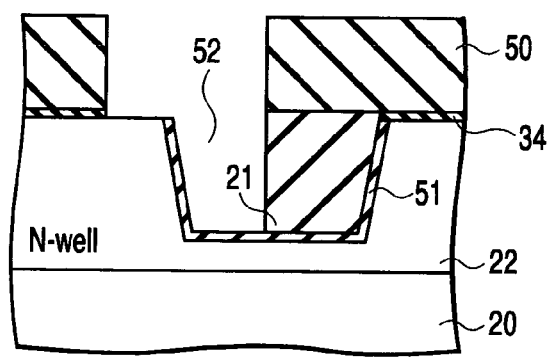
F I G. 7B
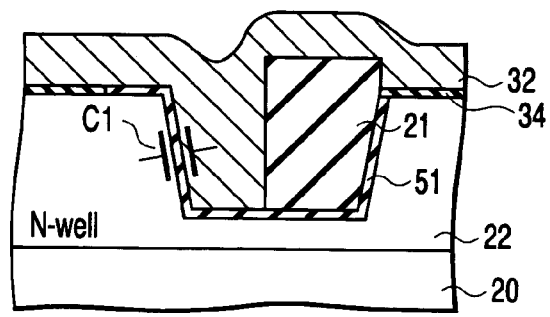
F I G. 7C

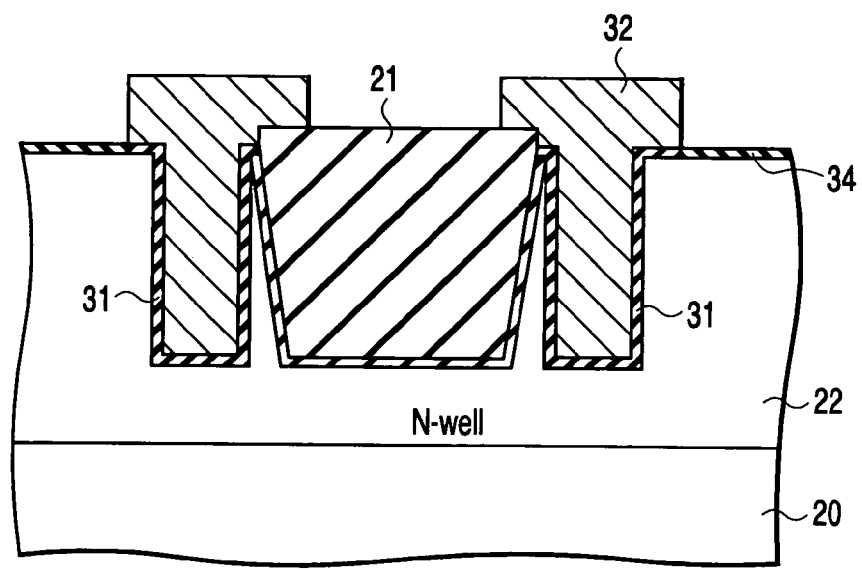
F I G. 1 8
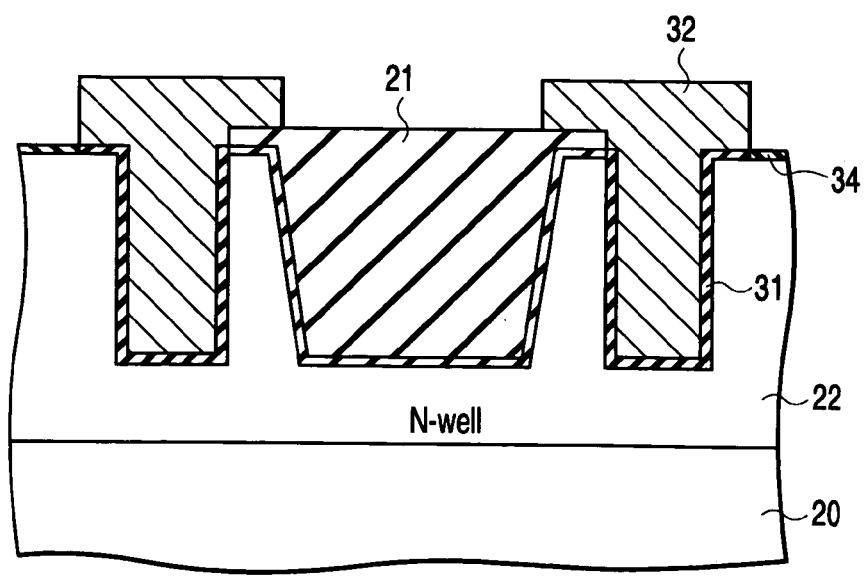
F I G. 2 0

SEMICONDUCTOR MEMORY DEVICE HAVING A SHALLOW TRENCH ISOLATION STRUCTURE

CROSS-REFERENCE TO RELATED APPLICATIONS

This application is based upon and claims the benefit of priority from prior Japanese Patent Applications No. 2003-431570, filed Dec. 25, 2003; and No. 2004-191448, filed Jun. 29, 2004, the entire contents of both of which are incorporated herein by reference.

BACKGROUND OF THE INVENTION

1. Field of the Invention

The present invention relates to a semiconductor memory device having a shallow trench isolation (STI) structure. In particular, the present invention relates to a semiconductor memory device including a static random access memory cell (SRAM cell).

2. Description of the Related Art

In recent years, SRAMs have a problem of causing a soft error resulting from cosmic rays such as α rays and neutron beams because scale-down of the element pattern and low voltage of the power supply have been advanced. More specifically, the signal charge held by the SRAM cell itself is remarkably smaller than other semiconductor devices, such as DRAM. For this reason, the amount of charge generated by the incidence of the cosmic rays becomes relatively larger than the signal charge held by the SRAM cell. If the charge by the cosmic rays reaches a storage node, data held in the storage node is inverted. The charge of the storage node held by the SRAM cell depends on the area of cell and a power supply voltage. Therefore, the charge held by the storage node is further reduced in accordance with scale-down of the element pattern and low voltage of the power supply. This is a factor of giving a great influence to the foregoing scale-down of the element pattern and low voltage of the power supply in the future technical generation.

For example, there has been conventionally known the following technique disclosed in JPN. PAT. APPLN. KOKAI Publication No. 10-79440 as a means of solving the problem of causing the soft error in the SRAM. According to the technique disclosed in the Publication, a conductive film is buried in a trench for STI, and thereafter, an insulating film is formed thereon. A gate electrode is further formed on the insulating film. In the way, capacitance is secured between the conductive film and the gate electrode; therefore, the capacitance of a storage node of the memory cell is increased.

However, according to the foregoing conventional technique, specific contact and interconnect are required in order to apply an electric potential to the conductive film buried in the trench for STI. As a result, the chip area increases.

BRIEF SUMMARY OF THE INVENTION

According to one aspect of the present invention, there is provided a semiconductor memory device comprising:

an N-well and a P-well formed in a semiconductor substrate, and isolated from each other with a plurality of isolation regions each having a trench structure;

a first CMOS inverter circuit including a first P-channel MOS transistor, which has a gate electrode, a source region, a drain region and a channel region, and is formed on the N-well, and a first N-channel MOS transistor, which has a gate electrode connected common to the gate electrode of the first P-channel MOS transistor, a source region, a drain region connected common to the drain region of the first P-channel MOS transistor and a channel region, and is formed on the P-well;

a second CMOS inverter circuit including a second N-channel MOS transistor, which has a gate electrode, a source region, a drain region and a channel region, and is formed on the N-well, and a second N-channel MOS transistor, which has a gate electrode connected common to the gate electrode of the second P-channel MOS transistor, a source region, a drain region connected common to the drain region of the second P-channel MOS transistor and a channel region, and is formed on the P-well, the second CMOS inverter circuit forming a static memory cell together with the first CMOS inverter circuit;

a first capacitor connected between a gate electrode common connection node of the first P-channel and N-channel MOS transistors and one of the N-well and the P-well; and a second capacitor connected between a gate electrode common connection node of the second P-channel and N-channel MOS transistors and one of the N-well and the P-well.

BRIEF DESCRIPTION OF THE SEVERAL VIEWS OF THE DRAWING

FIGS. 7A to 7C are cross-sectional views successively showing the process of manufacturing a cell array of an SRAM device according to a third embodiment of the present invention;

FIG. 18 is a cross-sectional view of the cell array shown in FIG. 17;

FIG. 20 is a cross-sectional view showing an SRAM cell array according to a ninth embodiment of the present invention;

DETAILED DESCRIPTION OF THE INVENTION

<First Embodiment>

Figure 1:
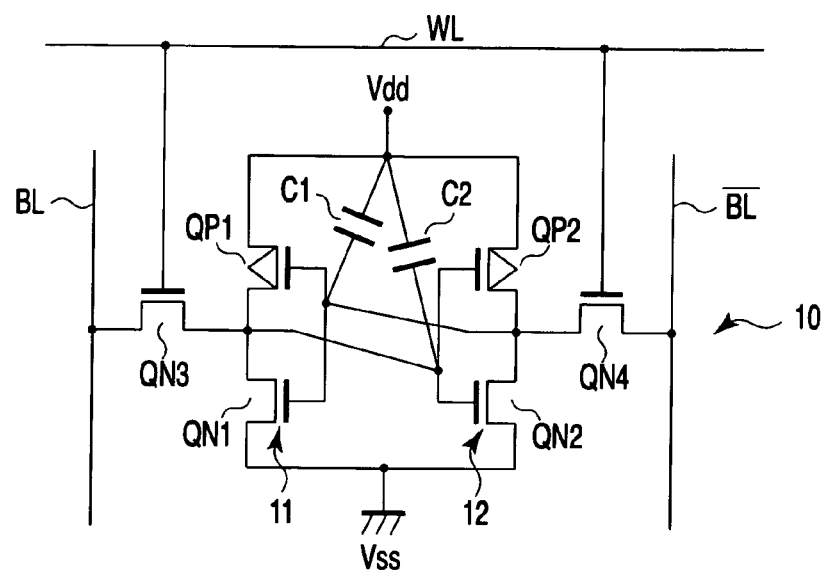
FIG. 1 is an equivalent circuit diagram showing an SRAM cell included in an SRAM device according to a first embodiment of the present invention.

FIG. 1 shows one SRAM cell included in a cell array of an SRAM device according to a first embodiment of the present invention together with a pair of bit lines BL, /BL and a word line WL.

An SRAM cell 10 includes first and second CMOS inverter circuits 11 and 12. The first CMOS inverter circuit 11 includes a first driver NMOS transistor (N-channel MOS transistor) QN1 and a first load PMOS transistor (P-channel MOS transistor) QP1. These transistors QN1 and QP1 have a commonly connected gate. The second CMOS inverter circuit 12 includes a second driver NMOS transistor QN2 and a second load PMOS transistor QP2, which have a commonly connected gate. The first and second CMOS inverter circuits 11 and 12 are configured so that their input and output nodes make a cross-coupled connection. Thus, the output nodes of the first and second CMOS inverter circuits 11 and 12 function as a pair of storage nodes holding complementary data.

The output nodes of the first and second CMOS inverter circuits 11 and 12 are connected respectively to bit lines BL and /BL via third and fourth NMOS transistors QN3 and QN4 for transfer gate.

The gate electrodes of the third and fourth NMOS transistors QN3 and QN4 are connected to the word line WL in common. The bit lines BL and /BL are each connected with a sense amplifier via column switch transistors.

A first capacitor C1 is connected between a common connection node of the gate electrodes of the first NMOS and PMOS transistors QN1 and QP1 and a supply node of power supply voltage (potential) (Vdd). A second capacitor C2 is connected between a common connection node of the gate electrodes of the second NMOS and PMOS transistors QN2 and QP2 and the supply node of power supply voltage (Vdd). The foregoing first and second capacitors C1 and C2 have the same capacitance.

In a read operation of data from the SRAM cell 10, the word line WL is activated. Thus, third and fourth NMOS transistors QN3 and QN4 are both turned on. A cell current flows through one of the bit lines BL and /BL in accordance with the potential of the paired storage nodes of the SRAM cell 10. In this way, one of the bit lines BL and /BL is set to the "L" level while the other thereof is set to the "H" level.

In a write operation of data from the SRAM cell 10, the word line WL is activated. Thus, third and fourth NMOS transistors QN3 and QN4 are both turned on. The potential of the paired storage nodes of the SRAM cell 10 is set in accordance with complementary data supplied to the bit lines BL and /BL.

Figure 2:
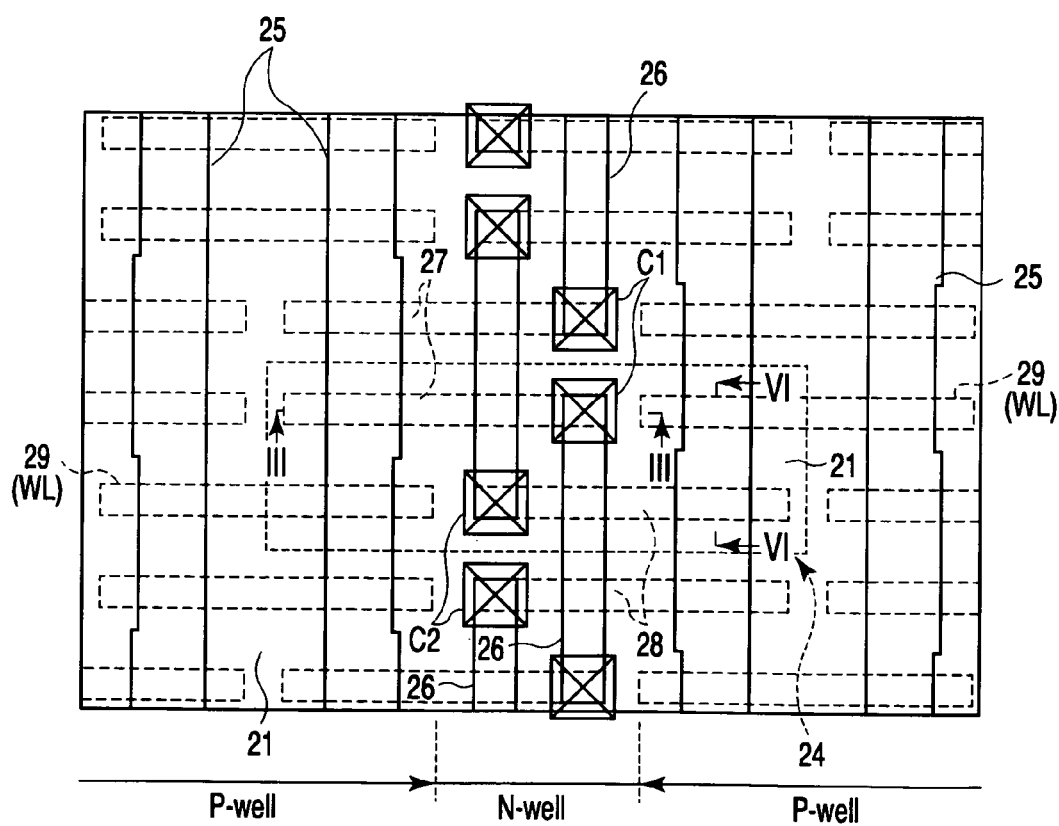
FIG. 2 is a top plan view showing the pattern layout of a cell array having the SRAM cell shown in FIG. 1.
Figure 3:
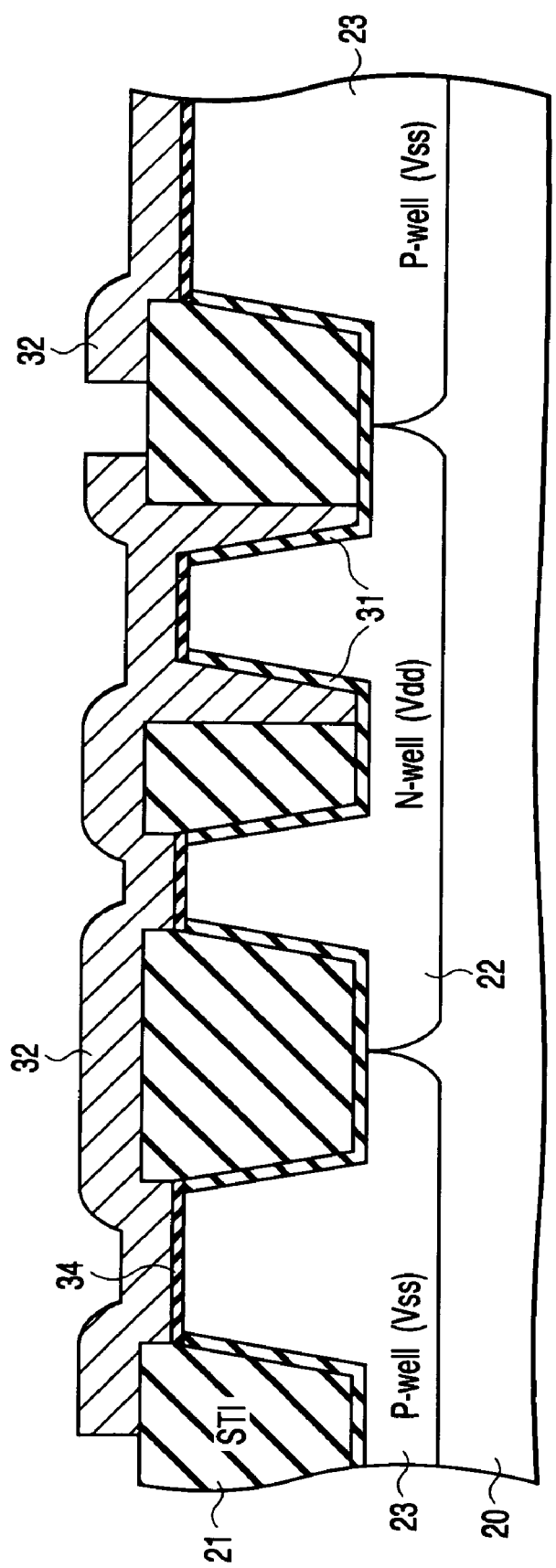
FIG. 3 is a cross-sectional view of FIG. 2.
Figure 4:
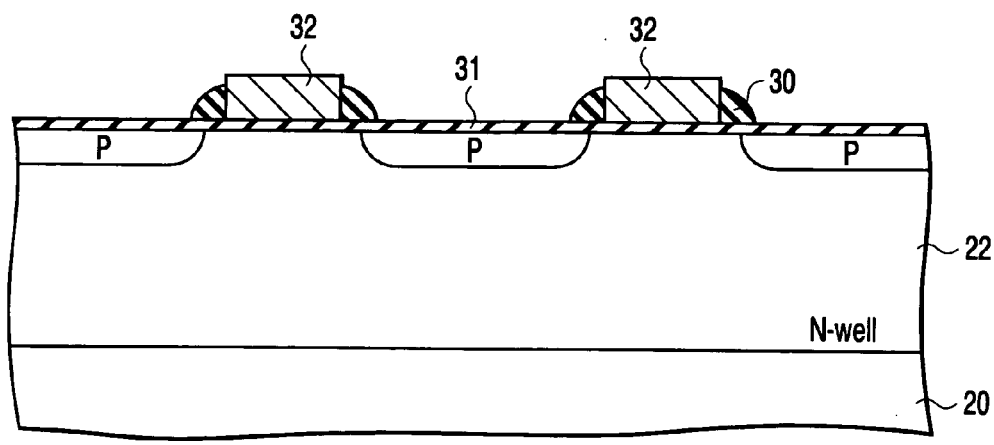
FIG. 4 is a cross-sectional view of FIG. 2 different from FIG. 3.

FIG. 2 shows the partial pattern layout of a cell array having matrix-like arrayed SRAM cells shown in FIG. 1. FIG. 3 and FIG. 4 are different cross-sectional views of FIG. 2.

As shown in FIG. 2 to FIG. 4, a semiconductor substrate, for example, Si substrate 20 is formed with several STI regions 21 having a shallow trench isolation structure. An element regions isolated via the STI regions is formed with an N-well 22 for forming a PMOS transistor and a P-well 23 for forming an NMOS transistor. A power supply potential Vdd is applied to the N-well 22; on the other hand, ground potential Vss is applied to the P-well 22.

A cell region 24 of each SRAM cell is formed with active areas 25 and 26. The active area 25 is formed on the surface layer of the P-well 23, and includes the drain, source and channel regions of a NMOS transistor. The active area 26 is formed on the surface layer of the N-well 22, and includes the drain, source and channel regions of a PMOS transistor. The cell region 24 is further formed with gate interconnects 27, 28 and 29 (word line). The gate interconnect 27 includes the gate electrodes of NMOS and PMOS transistors QN1 and QP1 forming the first CMOS inverter circuit 11. The gate interconnect 28 includes the gate electrodes of NMOS and PMOS transistors QN2 and QP2 forming the second CMOS inverter circuit 12. The gate interconnect (word line) 29 includes the gate electrodes of the third and fourth NMOS transistors QN3 and QP4 for transfer gate. In the first embodiment, the gate interconnects including the gate electrode is formed of polysilicon. The sidewall of the polysilicon gate interconnect is formed with a spacer 30 formed of SiN or $SiO_2$. The NMOS transistors each have a lightly doped drain (LDD) structure.

A first capacitor C1 is formed at the position of the STI region 21 adjacent to the distal portion of the drain region of the second PMOS transistor QP2. A second capacitor C2 is formed at the position on the STI region 21 adjacent to the distal portion of the drain region of the first PMOS transistor QP1.

The first capacitor C1 is formed in the following manner as illustrated in FIG. 3. More specifically, a capacitor insulating film, that is, gate oxide film 31 is formed so that one side contacts with the N-well 22 in a recess formed in the STI region 21 adjacent to the drain region of the second PMOS transistor QP2. A conductor, for example, polysilicon 32 is filled in the recess so that it contacts with the other side of the capacitor insulating film 31. The polysilicon 32 is further extended to the gate interconnect 27 of the first CMOS inverter circuit 11.

The second capacitor C2 is formed in substantially the same manner as the first capacitor C1, although not illustrated in FIG. 3. More specifically, a capacitor insulating film, that is, gate oxide film 31 is formed so that its one side contacts with the N-well 22 in each recess formed on both sides of the drain region distal portion of the STI region 21. In this case, the STI region is adjacent to the distal portion of the drain region of the first PMOS transistor QP1, and isolates N-well and P-well from each other. A conductor, for example, polysilicon 32 is filled in the recess so that it contacts with the other side of the capacitor insulating film 31. The polysilicon 32 is extended to the gate interconnect 28 of the second CMOS inverter circuit 12.

Incidentally, the following contact regions are formed although not illustrated in FIG. 2. The contact regions are a word line contact region and a bit line contact region. Another is a Vss contact region for connecting the source region of the first NMOS transistor QN1 to a ground voltage Vss node. Another is a Vss contact region for connecting the source region of the second NMOS transistor QN2 to a ground voltage Vss node. Another is a Vdd contact region for connecting the source region of the first PMOS transistor QP1 to a Vdd node. Another is a Vdd contact region for connecting the source region of the second PMOS transistor QP2 to a Vdd node.

FIGS. 5A to 5G are cross-sectional views successively showing the process of manufacturing the SRAM cell array shown in FIG. 2.

Figures 5A, 5B:
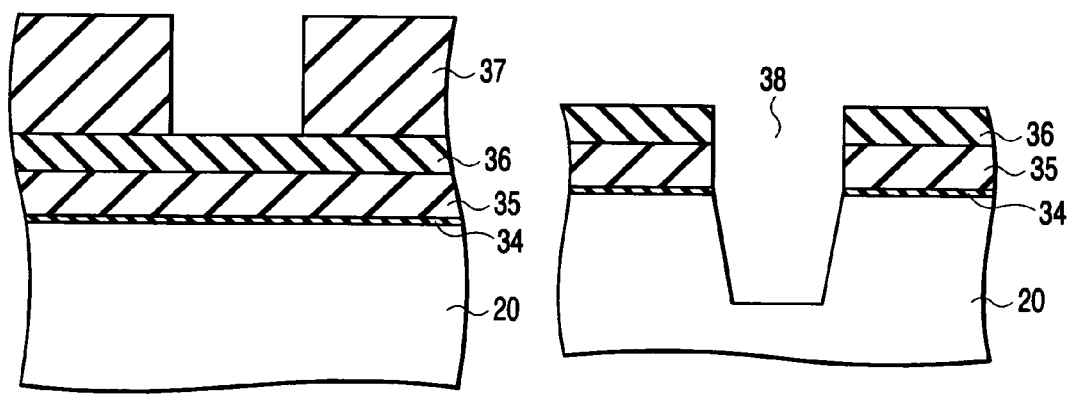
FIGS. 5A to 5G are cross-sectional views successively showing the process of manufacturing the cell array shown in FIG. 2.

As shown in FIG. 5A, an oxide film 34 is deposited on a semiconductor substrate, that is, Si substrate 20, and further, SiN film 35 and SiO$_2$ film 36 are deposited as a mask material. Resist is coated, and then, patterning is carried out so that a resist pattern 37 having a shape covering the active area is formed.

As illustrated in FIG. 5B, the mask material is patterned so that the resist pattern 37 is transferred to the mask material including the foregoing SiN film 35 and SiO$_2$ film 36. In the way, a mask pattern is formed. The resist pattern 37 is intactly left or removed, and thereafter, the substrate is etched by dry etching using the mask pattern, and thereby, a trench 38 is formed.

Figures 5C, 5D:
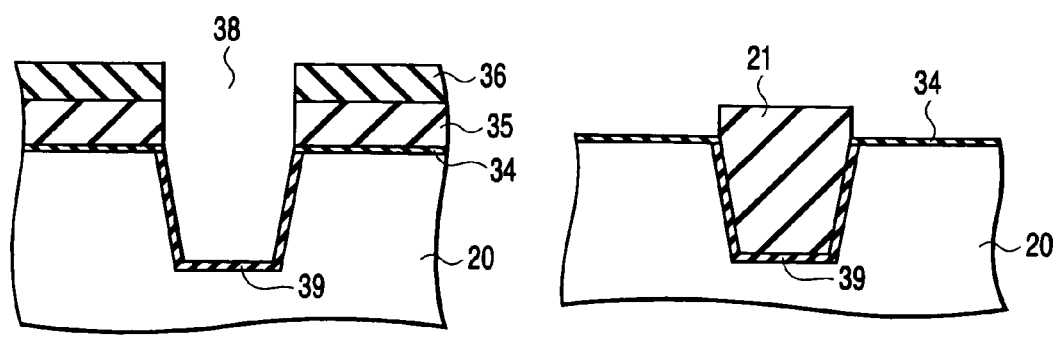

Thereafter, the resist pattern 37 is removed if it is left, and if necessary, post-treatment of removing depositions generated in the dry etching process is carried out. In this state, the Si substrate 20 is still exposed from the inner wall of the trench 38. For this reason, the inner surface of the trench 38 is oxidized so that an oxide film 39 is formed having a film thickness of about 10 nm as depicted in FIG. 5C.

Figure 5E:
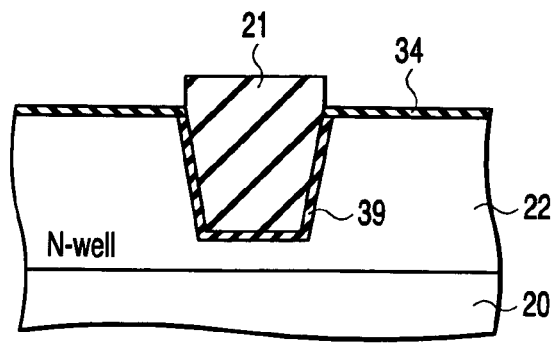

Then, the insulating film is deposited on the entire surface to fill the trench 38 with the insulating film, and planarization is made using Chemical Mechanical Polishing (CMP) technique. In the way, an STI region (STI insulating film) 21 is formed as seen from FIG. 5D. Thereafter, an impurity implantation mask is formed, and impurity is properly implanted while anneal is carried out, and thereby, N-well 22, P-well 23 and channel region are formed. FIG. 5E shows a portion formed with the N-well 22.

Figure 5F:
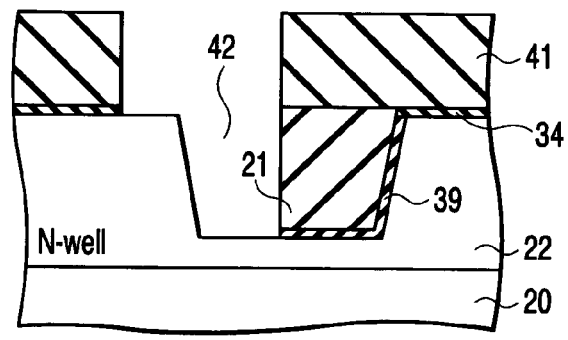

The STI region 21, the N-well 22, the P-well 23 and the channel region are formed in the manner as described above. Thereafter, as shown in FIG. 5F, resist is coated, and patterning is carried out to form an opening, which spreads over part of the STI region 21 existing on the capacitor forming region and part of the active area adjacent thereto. Thus, a resist pattern 41 is formed.

Etching is carried out using the resist pattern 41 under the etching condition having sufficient selectivity with respect to the Si substrate. In this way, part of the insulating film in the STI region 21 is removed. In this case, the etching depth is arbitrary. However, in order to increase the capacitor area, the insulating film and the oxide film 39 may be deeply etched and removed by the bottom of the STI region 21. The etching depth may be set to the height position of about 100 nm from the bottom of the STI region 21 so that a parasitic transistor is not formed. Thereafter, post-treatment of removing depositions generated in etching is carried out, if necessary. A recess 42 is formed at the position of the STI region 21.

Figure 5G:
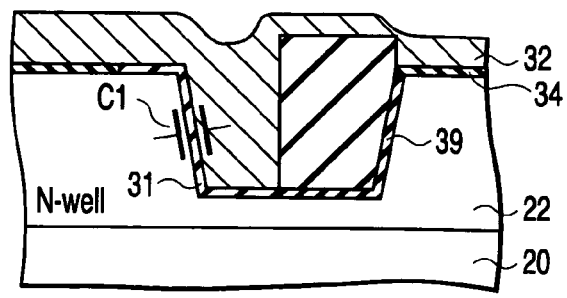

Thereafter, the resist pattern 41 is removed, and then, gate oxidization is carried out as illustrated in FIG. 5G. In this way, the thin capacitor insulating film 31 having a thickness of about several nm is formed in the recess inner surface of the STI region 21, that is, trench inner wall and on the upper surface of the active area adjacent thereto. Thereafter, in order to form the gate electrode of the MOS transistor, gate interconnects and capacitor electrode, a conductive material, that is, polysilicon 32 is deposited so that the recess 42 is filled with the polysilicon. Then, the polysilicon 32 is patterned, and thereby, the gate electrode, gate interconnects and capacitor electrode are formed.

The manufacturing process described above is carried out, and thereby, a capacitor having the capacitor insulating film 31 and the capacitor electrode of the polysilicon 32 is formed. As described before, the capacitor insulating film 31 is formed so that one side contacts with the N-well 22 in the recess 42 formed in the STI region 21. The capacitor electrode consists of the polysilicon 32 filled in the recess 42 so that it contacts with the other side of the capacitor insulating film 31.

In deposition of the polysilicon 32, if impurity-doped silicon, for example, phosphorus-doped polysilicon is used, there is no problem in particular. However, if un-doped polysilicon is used, impurity is implanted as the need arises. The order of the processes of patterning the polysilicon 32 and implanting impurity is optimally set in accordance with the gate process of forming polycide or salicide gate.

According to the foregoing manufacturing process, the inside of the STI region 21 is used, and thereby, each area of the first and second capacitors C1 and C2 is three-dimensionally secured. Therefore, this serves to prevent the size of the SRAM cell from increasing.

The SRAM device according to the first embodiment has the following structure. The first and second capacitors C1 and C2 are connected between input nodes of first and second CMOS inverter circuits of the SRAM cell having the STI structure and the N-well 22. Thus, the SRAM cell has much charge stored by itself, and the soft error is reduced. The gate oxide film is used as the capacitor insulating film 31; therefore, a thin insulating film having good quality is obtained. As a result, sufficient capacitance is secured. Polysilicon is used as the gate electrode; therefore, gate electrode is formed using the same process as the conventional case. Consequently, the SRAM of the first embodiment has process matching, and readily applicable to the conventional case.

<Second Embodiment>

Figure 6:
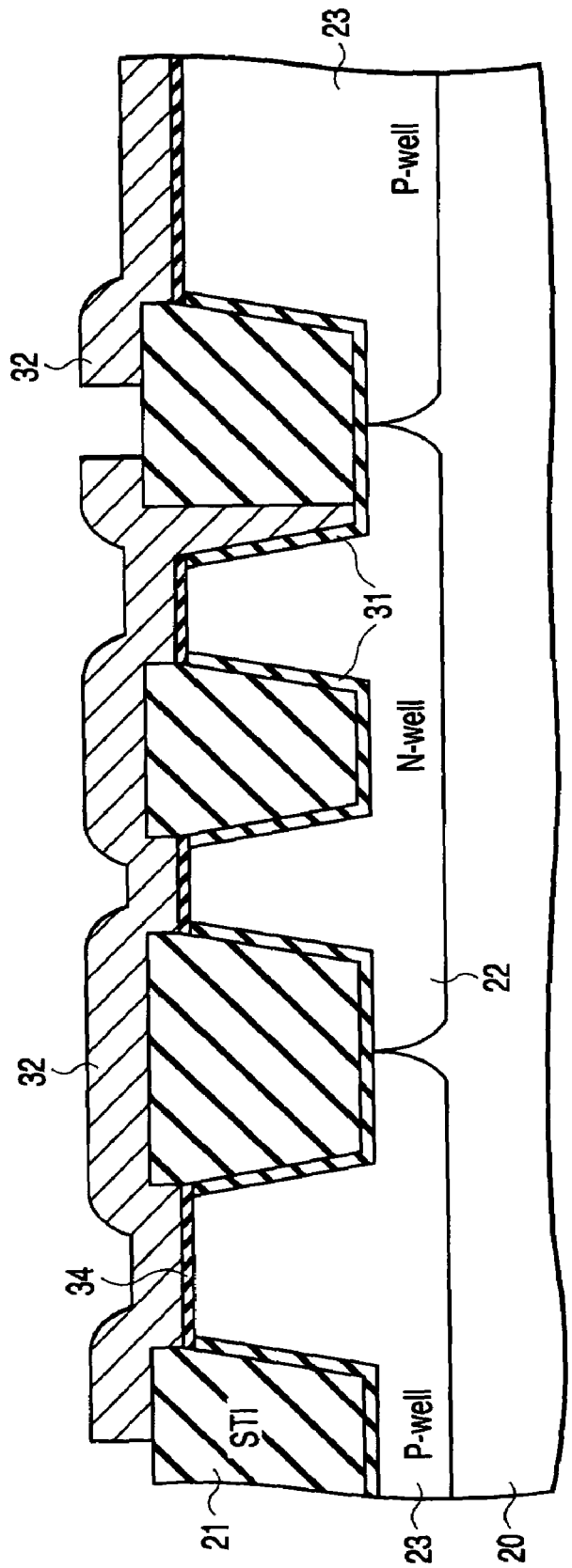
FIG. 6 is a cross-sectional view showing a cell array of an SRAM device according to a second embodiment of the present invention.

FIG. 6 shows the cross section corresponding to FIG. 3 in an SRAM device according to a second embodiment. The SRAM device of the second embodiment differs from the SRAM device of FIG. 3 excepting for the following point, and other structure is the same; therefore, the same reference numerals as FIG. 3 is given.

More specifically, the first capacitor C1 is formed in the recess formed at only one-side region of the distal portion of the drain region in the STI region adjacent to the distal portion of the drain region of the second PMOS transistor QP2. The second capacitor C2 has the same structure as the first capacitor C1. That is, the second capacitor C2 is formed in the recess formed at only one-side region of the distal portion of the drain region in the STI region adjacent to the distal portion of the drain region of the first PMOS transistor QP1.

<Third Embodiment>

According to the foregoing first and second embodiments, the gate oxide film obtained by oxidizing the inner wall of trench is used as the capacitor insulating film 31. When pure-oxide film and oxynitride film having low dielectric constant are used as the oxide film, a sufficient capacitance of the capacitor is not obtained.

Thus, according to the third embodiment, a nitride film is used as the capacitor insulating film to increase the capacitance of the capacitor. The third embodiment will be described below.

The process of manufacturing the SRAM of the third embodiment is the same as the first embodiment. More specifically, the substrate 20 is formed with the trench 38, and thereafter, as shown in FIG. 7A, the inner wall of the trench is nitrified by about several nanometer to 10 nm to form a nitride film 51. Thereafter, the STI region 21, the N-well 22, the P-well 23 and the channel region are formed in the same manner as the first and second embodiments. As illustrated in FIG. 7B, a resist pattern 50 having an opening is formed. The opening spreads from part of the upper portion of the STI region 21 forming a capacitor onto the neighboring active area. Using the resist pattern 50 as an etching mask, the insulating film in the STI region 21 is etched under the sufficient selectivity condition with respect to the nitride film 51 in addition to the Si substrate 20. In this way, a recess 52 is formed. Thereafter, the same process as the first and second embodiments is carried out, and then, a capacitor shown in FIG. 7C is formed. In FIG. 7C, the same reference numerals are used to designate portions identical to FIG. 5G.

According to the third embodiment, the SRAM cell having the STI structure, first and second capacitors are formed like the first and second embodiments. The first and second capacitors are formed, and thereby, soft error is reduced. In this case, the nitride film 51 obtained by nitrifying the inner wall of the trench and having high dielectric constant is used as the capacitor insulating film. Therefore, it is possible to secure a large capacitance, and to increase the capacitance as compared with the first and second embodiments even if the capacitor area is the same as these embodiments.

<Fourth Embodiment>

In the foregoing first to third embodiments, polysilicon is used as gate electrode, gate interconnects and capacitor electrode. According to the fourth embodiment, metal is used as gate electrode, gate interconnects and capacitor electrode, and the fourth embodiment will be described below.

Figure 8A:
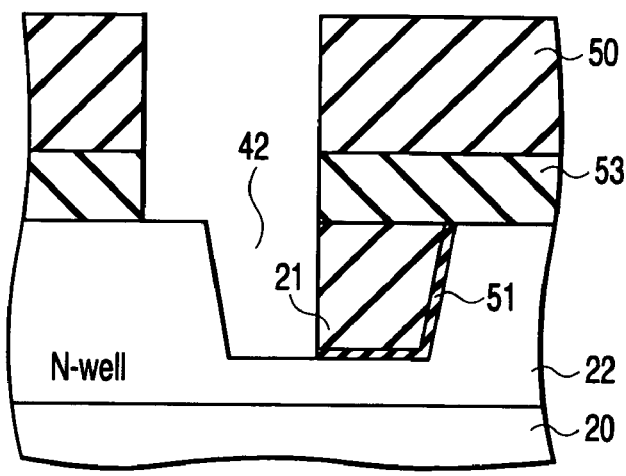
FIGS. 8A and 8B are cross-sectional views successively showing the process of manufacturing a cell array of an SRAM device according to a fourth embodiment of the present invention.

According to the manufacturing process of the fourth embodiment, the STI region 21, the N-well 22, the P-well 23 and the channel region are formed as shown in FIG. 8A in the same manner as the first and second embodiments. In this case, either of the oxide film 31 or nitride film 51 may be formed on the inner wall of trench. In FIG. 8A shows the case where the nitride film 51 is formed. Then, an oxide film 53 is deposited by a necessary film thickness as an insulating film. Thereafter, a resist pattern 50 is formed. Using the resist pattern 50 as a mask, a gate electrode buried interconnect trench and a capacitor forming recess 42 are formed. In this case, the order of forming the interconnect trench and the recess 42 is arbitrarily selected in accordance with patterning characteristic.

Figure 8B:
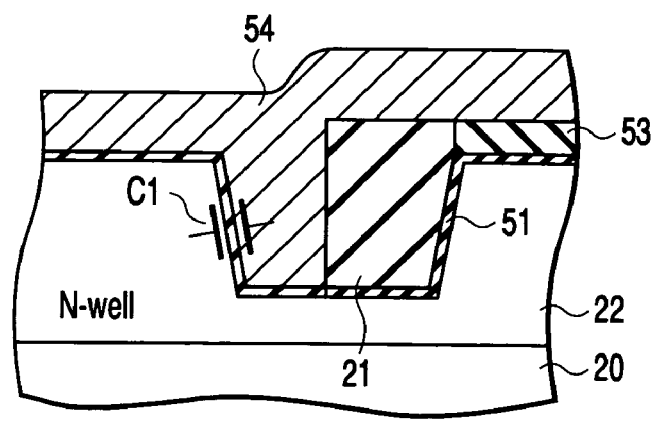

As illustrated in FIG. 8B, an oxide film is formed on the active area and the inner wall of the trench. Thereafter, metal, for example, tungsten 54 is deposited on the entire surface to form gate electrode, gate interconnects and capacitor electrode.

According to the fourth embodiment, the SRAM cell having STI structure, first and second capacitors C1 and C2 are formed, and soft error is reduced like the first and second embodiments. In this case, the metal 54 is used as the gate electrode, gate interconnects and capacitor electrode. Therefore, the resistance of the capacitor electrode is reduced as compared with the case where polysilicon is used. In addition, the entire region of the recess 42 formed in the STI region 21 is used as the capacitor electrode, so that a large capacitance is secured.

<Fifth Embodiment>

Figure 9:
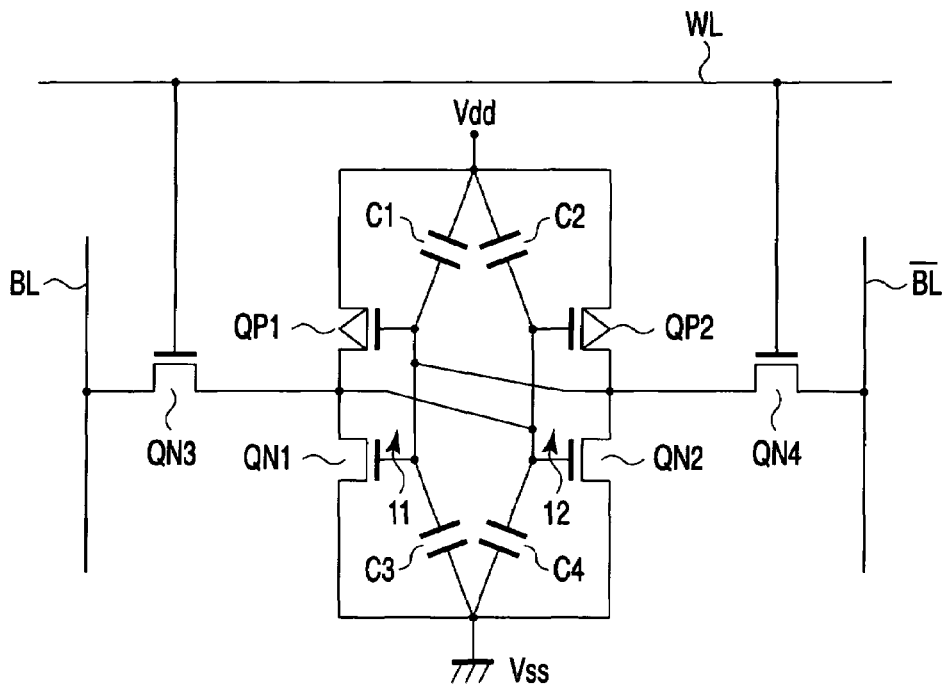
FIG. 9 is an equivalent circuit diagram showing an SRAM cell included in an SRAM device according to a fifth embodiment of the present invention.

FIG. 9 shows one SRAM cell included in an SRAM cell array according to a fifth embodiment of the present invention together with a pair of bit lines BL, /BL and a word line WL.

The SRAM cell according the fifth embodiment differs from the SRAM cell of the foregoing first embodiment shown in FIG. 1 in the following point. More specifically, a third capacitor C3 is connected between a gate common connection node of the first CMOS inverter circuit 11 and a Vss node. A fourth capacitor C4 is connected between a gate common connection node of the second CMOS inverter circuit 12 and the Vss node. Other configuration is the same as FIG. 1; therefore, the same reference numerals as FIG. 1 are used. The foregoing third and fourth capacitors C3 and C4 are formed to have the same capacitance.

Figure 10:
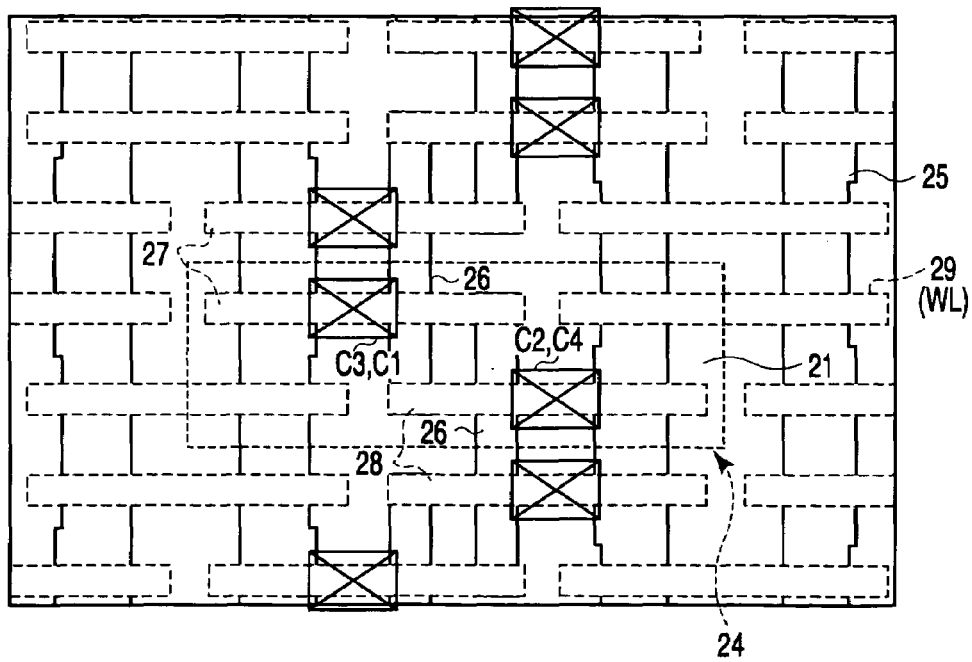
FIG. 10 is a top plan view showing the pattern layout of a cell array having the SRAM cell shown in FIG. 9.

FIG. 10 shows the partial pattern layout of a cell array having matrix-like arrayed SRAM cells shown in FIG. 9. The pattern layout shown in FIG. 10 differs from the pattern layout of the first embodiment shown in FIG. 1 in the capacitor formed position. Other configuration is the same as FIG. 2; therefore, the same reference numerals are used to designate portions identical to FIG. 2, and the details are omitted.

Figure 12A:
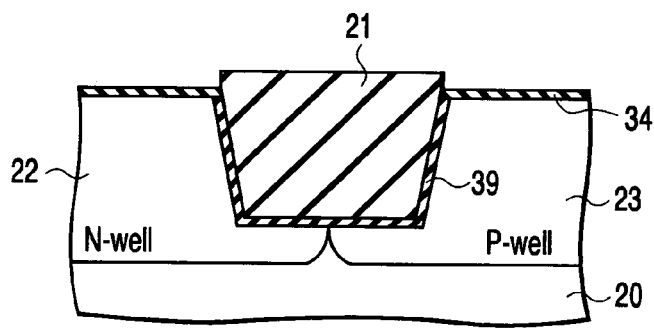
FIGS. 12A and 12B are cross-sectional views successively showing the process of manufacturing the cell array shown in FIG. 10.
Figure 12B:
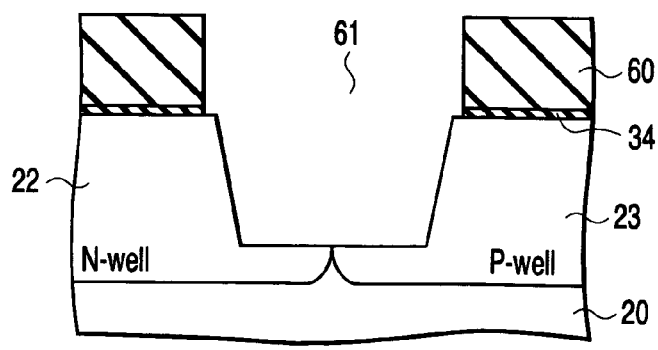

The first and third capacitors C1 and C3 are adjacent to the active area 25 of the first PMOS transistors QP1 and the active area 26 of the first NMOS transistors QN1. These capacitors C1 and C3 are both formed in a well isolation STI region 21 positioned between both active regions 25 and 26, that is, in a recess 61 formed as shown in FIG. 12B.

Figure 11:
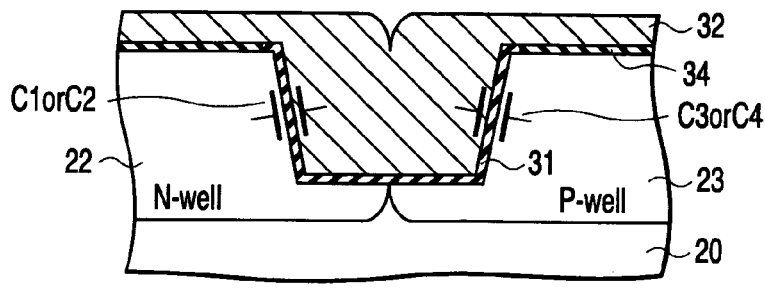
FIG. 11 is a cross-sectional view of the cell array shown in FIG. 10.

As seen from FIG. 11, in the first capacitor C1, the capacitor insulating film 31 is formed so that one side contacts with the N-well 22 in the recess 61. Polysilicon 32 is filled in the recess 61 to contact with the other side of the capacitor insulating film 31. The polysilicon 32 is formed to continue to the gate electrode of the first PMOS transistor QP1. On the other hand, in the third capacitor C3, the polysilicon 32 is filled to contact with the other side of the capacitor insulating film 31, which is formed so that one side contacts with the P-well 23 in the recess 61. The polysilicon 32 is formed to extend to the gate electrode of the first NMOS transistor QN1.

The second and fourth capacitors C2 and C4 are adjacent to the active area of the second PMOS transistors QP2 and the active area of the second NMOS transistors QN2, like the first and third capacitors C1 and C3. These capacitors C2 and C4 are both formed in the recess 61 formed in the well isolation STI region 21.

In the second capacitor C2, the capacitor insulating film 31 is formed so that one side contacts with the N-well 22 in the recess 61. Polysilicon 32 is filled in the recess 61 to contact with the other side of the capacitor insulating film 31. The polysilicon 32 is formed to continue to the gate electrode of the second PMOS transistor QP2.

In the fourth capacitor C4, the polysilicon 32 is filled to contact with the other side of the capacitor insulating film 31, which is formed so that one side contacts with the P-well 23 in the recess 61. The polysilicon 32 is formed to continue to the gate electrode of the second NMOS transistor QN2.

The process of manufacturing the SRAM cell of the fifth embodiment is carried out in the same manner as the first embodiment. As shown in FIG. 12A, the STI region 21, the N-well 22, the P-well 23 and the channel region are formed. Thereafter, as illustrated in FIG. 12B, resist is coated, and a resist pattern 60 is formed to have an opening, which spreads over the well isolation STI region 21 existing on the capacitor forming region and part of the active area adjacent thereto. The substrate is etched using the resist pattern 60 under the etching condition having sufficient selectivity with respect to the Si substrate 20. In this way, the insulating film in the STI region 21 is removed by etching. In this case, the etching depth is arbitrary. However, in order to increase the capacitor area, the insulating film and the oxide film 39 may be deeply etched and removed by the bottom of the STI region 21. The etching depth may be set to the height position of about 100 nm from the bottom of the STI region 21 so that a parasitic transistor is not formed. Thereafter, post-treatment of removing depositions generated in etching is carried out, if necessary. A recess 61 is formed at the position of the STI region 21.

Thereafter, the resist pattern 60 is removed, and gate oxidization is carried out. As depicted in FIG. 11, a thin capacitor insulating film 31 having a thickness of about several nm is formed in the recess inner surface of the trench of the STI region 21 and on the upper surface of the active area adjacent thereto. Thereafter, in order to form the gate electrode of the MOS transistor, gate interconnects and capacitor electrode, a conductive material, that is, polysilicon 32 is deposited so that the recess 61 is filled with the polysilicon. Then, the polysilicon 32 is patterned to form the foregoing gate electrode, gate interconnects and capacitor electrode.

In deposition of the polysilicon 32, if impurity-doped silicon, for example, phosphorus-doped polysilicon is used, there is no problem in particular. However, if un-doped polysilicon is used, impurity is implanted as the need arises. The order of the processes of patterning the polysilicon 32 and implanting impurity is optimally set in accordance with the gate process of forming polycide or salicide gate.

The manufacturing process described above is carried out, and thereby, two capacitors each having the following structure are formed. According to the structure, the capacitor has insulating film 31 formed so that one side contacts with the N-well 22 and the P-well 23, and polysilicon 32 filled to contact with the other side of the capacitor insulating film 31.

According to the fifth embodiment, SRAM cells having the STI structure and first to fourth capacitors are formed. Thus, the SRAM cell has much charge stored by itself, and the soft error is reduced. The gate oxide film is used as the capacitor insulating film 31; therefore, a thin insulating film having good quality is obtained. As a result, sufficient capacitance is secured. The polysilicon 32 is used as the gate electrode; therefore, gate electrode is formed using the same process as the conventional case. Consequently, the SRAM of the fifth embodiment has process matching, and readily applicable to the conventional case.

<Sixth Embodiment>

The sixth embodiment differs from the fifth embodiment in that a nitride film is used as the capacitor insulating film to increase the capacitance value of a capacitor. Other configuration is the same as the first embodiment.

Figure 13A:
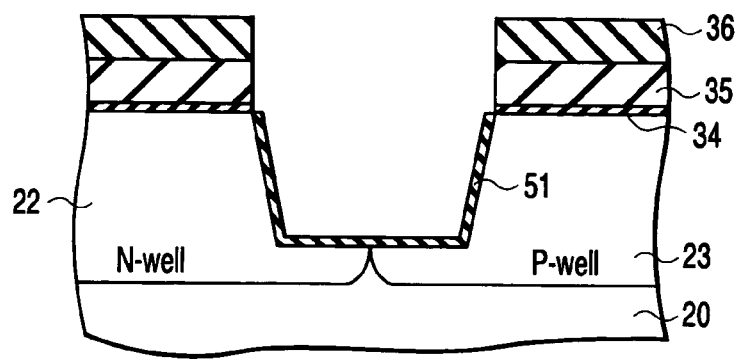
FIGS. 13A to 13C are cross-sectional views successively showing the process of manufacturing a cell array of an SRAM device according to a sixth embodiment of the present invention.
Figure 13B:
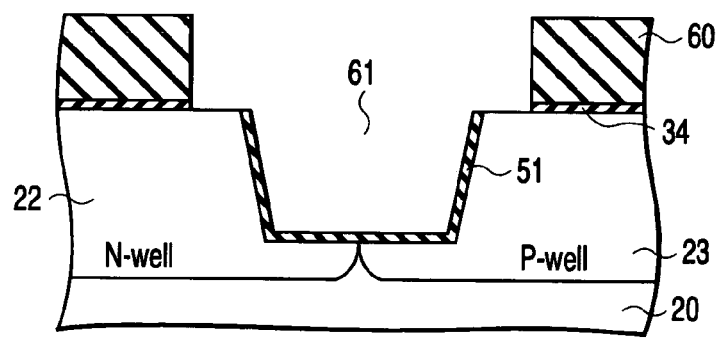
Figure 13C:
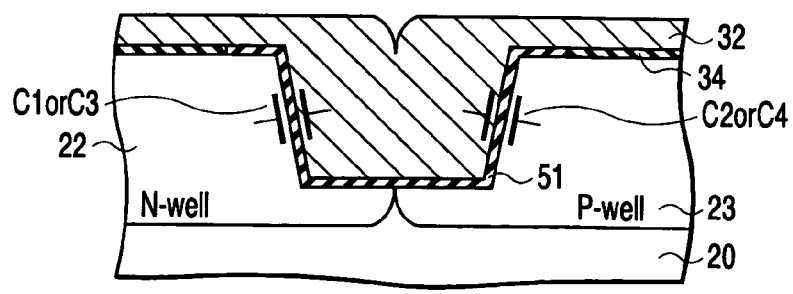

The process of manufacturing an SRAM device of the fifth embodiment is substantially the same as the fifth embodiment. The process of forming the nitride film 51 is substantially the same as the fifth embodiment. More specifically, the trench is formed like the fifth embodiment, and thereafter, the inner wall of the trench is nitrified by several to 10 nm to form the nitride film 51, as shown in FIG. 13A. The STI region 21, the N-well 22, the P-well 23 and the channel region are formed like the fifth embodiment. A resist pattern 60 is formed to have an opening, which spreads over the STI region 21 forming the capacitor and part of the active area adjacent thereto. Using the resist pattern 60 as a etching mask, the insulating film is etched under the etching condition having sufficient selectivity with respect to the nitride film 51 in addition to the Si substrate 20, as illustrated in FIG. 13B. In this way, a recess 61 is formed. Thereafter, the same process as the fifth embodiment is carried out, and then, a capacitor shown in FIG. 13C is formed. Incidentally, after the resist pattern 60 shown in FIG. 13B is removed, gate oxidization is carried out, and thereby, the oxide film 34 is formed on the entire surface of substrate as seen from FIG. 13C.

According to the sixth embodiment, SRAM cells having the STI structure and first to fourth capacitors are formed, like the fifth embodiment. Thus, the SRAM cell has much charge stored by itself, and the soft error is reduced. In this case, the nitride film, which is obtained by nitrifying the inner wall of the trench and has high dielectric constant, is used as the capacitor insulating film 31. Therefore, a large capacitance is secured, and the capacitance is increased even if the capacitor area is the same as the case of the fifth embodiment.

In the sixth embodiment, metal may be used as the gate electrode, the gate interconnects and the capacitor electrode to increase the capacitance, like the fourth embodiment described before. In this case, the manufacturing process is substantially the same as the fifth embodiment. The process of forming the gate electrode, the gate interconnects and the capacitor electrode is substantially the same as the third embodiment.

Thus, metal is used as the gate electrode, the gate interconnects and the capacitor electrode, and thereby, the resistance of the capacitor electrode is reduced as compared with the case where polysilicon is used. In addition, the entire insulating film of the STI region 21 is removed, and thereby, all region of the recess 61 is used as the capacitor electrode. Therefore, a larger capacitance is secured.

<Seventh Embodiment>

Figure 14:
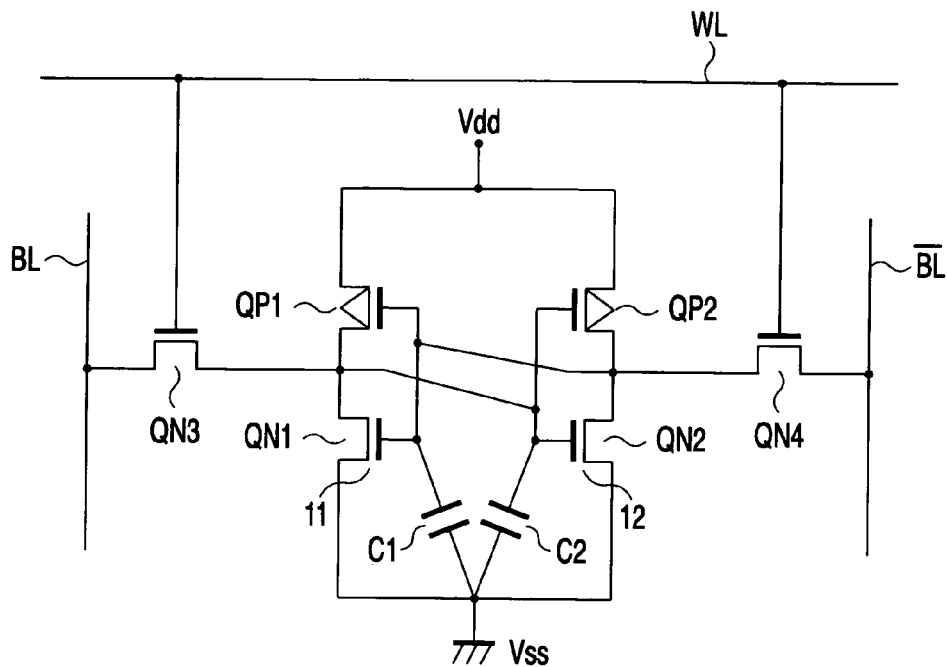
FIG. 14 is an equivalent circuit diagram showing an SRAM cell included in an SRAM device according to a seventh embodiment of the present invention.

FIG. 14 shows an SRAM cell included in an SRAM cell array according to a seventh embodiment of the present invention together with a pair of bit lines BL, /BL and a word line WL.

The seventh embodiment differs from the first embodiment in the following point, and other configuration is the same as the first embodiment. More specifically, a first capacitor C1 is connected between a gate common connection node of the first CMOS inverter circuit 11 and a Vss node. A second capacitor C2 is connected between a gate common connection node of the second CMOS inverter circuit 12 and the Vss node.

Figure 15:
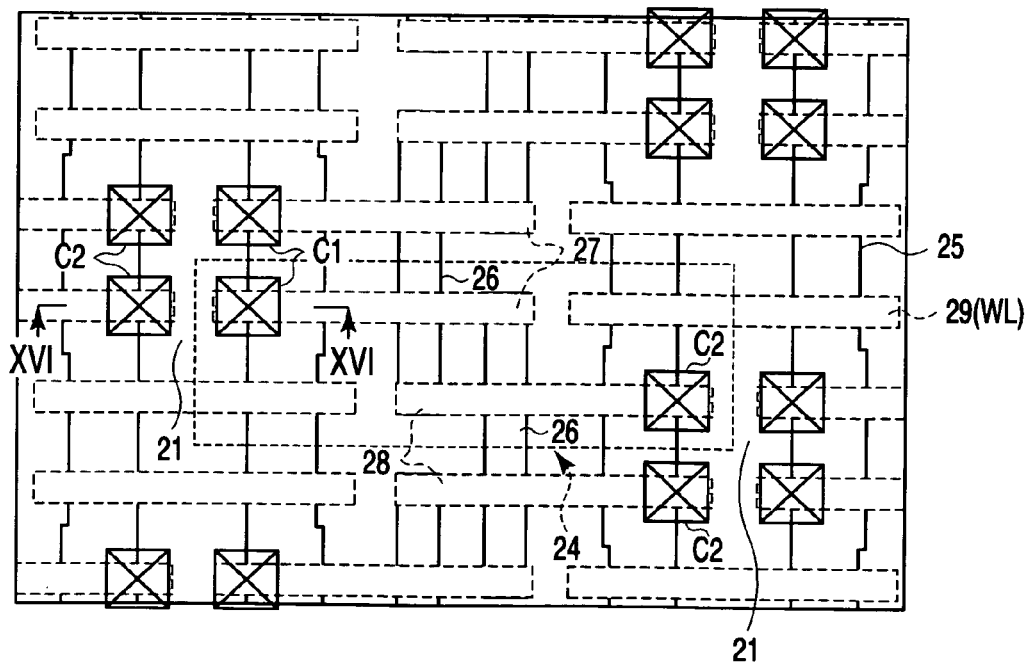
FIG. 15 is a top plan view showing the pattern layout of a cell array having the SRAM cell shown in FIG. 14.
Figure 16:
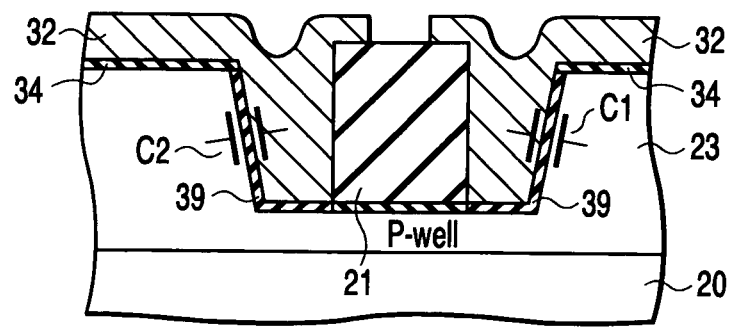
FIG. 16 is a cross-sectional view of the cell array shown in FIG. 15.

FIG. 15 shows the partial pattern layout of a cell array having matrix-like arrayed SRAM cells shown in FIG. 14. FIG. 16 is a cross-sectional view of FIG. 15.

The layout pattern shown in FIG. 15 differs from the layout pattern of the first embodiment shown in FIG. 2 in position forming the first and second capacitors C1 and C2. Other configuration is the same as the first embodiment; therefore, the same reference numerals are used to designate portions identical to FIG. 2, and the details are omitted.

As seen from FIG. 15, the STI region 21 existing on the position formed with capacitor is an NMOS transistor isolation region existing between neighboring two cell regions 24.

In the first capacitor C1, polysilicon 32 is filled in a recess formed in the insulating film of the NMOS transistor isolation STI region 21. In this case, the polysilicon 32 is filled to contact with the other side of the capacitor insulating film 31, which is formed so that one side contacts with the P-well 23. The polysilicon 32 extends to the gate electrode of the first NMOS transistor QN1 shown in FIG. 14.

The second capacitor C2 has the same structure as the capacitor C2 of the first embodiment. More specifically, in the second capacitor C2, polysilicon 32 is filled in a recess formed in the insulating film of the NMOS transistor isolation STI region 21. In this case, the polysilicon 32 is filled to contact with the other side of the capacitor insulating film 31, which is formed so that one side contacts with the P-well 23. The polysilicon 32 extends to the gate electrode of the second NMOS transistor QN2 shown in FIG. 14.

The process of manufacturing the SRAM cell of the seventh embodiment is the same as the first embodiment. In the SRAM device of the seventh embodiment, the first and second capacitors are connected between the input node of the first and second CMOS inverter circuits and the P-well 23, like the SRAM device of the first embodiment. In this way, it is possible to increase the amount of charge stored by the SRAM cell itself, and to reduce soft error.

In the seventh embodiment, the nitride film may be used as the capacitor insulating film to increase the capacitance. In addition, metal may be used as gate electrode, gate interconnects and capacitor electrode, like the foregoing fourth embodiment.

<Eighth Embodiment>

The eighth embodiment differs from the first embodiment in capacitor forming position.

Figure 17:
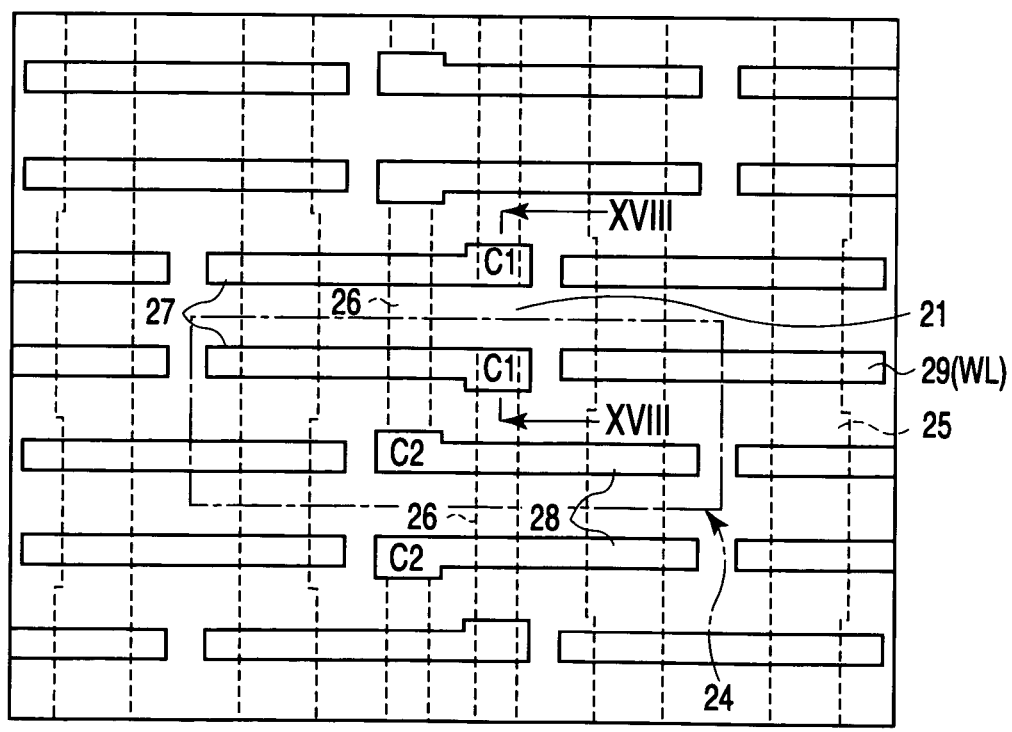
FIG. 17 is a top plan view showing the pattern layout of an SRAM cell array according to an eighth embodiment of the present invention.

FIG. 17 shows the pattern layout of a cell array having matrix-like arrayed SRAM cells shown in FIG. 1 in the eighth embodiment. The layout pattern shown in FIG. 17 differs from the pattern layout of the first embodiment shown in FIG. 2 in the forming position of the first and second capacitors C1 and C2. Other configuration is the same; therefore, the same reference numerals are used to designate portions identical to FIG. 2, and the details are omitted.

As seen from the pattern shown in FIG. 17, the first capacitor C1 is formed at the distal portion opposite to the active area of the second PMOS transistor QP2 in the cell region 24. The second capacitor C2 is formed at the distal portion opposite to the active area of the first PMOS transistor QP1 in the cell region 24.

FIG. 18 is a cross-sectional view of FIG. 17. The first capacitor C1 is formed with a capacitor insulating film 31. The capacitor insulating film 31 is formed so that one-side contacts with the N-well 22 in a recess formed in the N-well 22 at the distal portion of the active area of the second PMOS transistor QP2. Polysilicon 32 is filled to contact with the other side of the capacitor insulating film 31. The polysilicon 32 is formed to continue to a polysilicon gate interconnect 27 of the first CMOS inverter circuit of FIG. 17.

The second capacitor C2 is formed in the same manner as the first capacitor C1. More specifically, the capacitor insulating film 31 is formed so that one-side contacts with the N-well 22 in a recess formed in the N-well 22 at the distal portion of the active area of the first PMOS transistor QP1. Polysilicon 32 is filled to contact with the other side of the capacitor insulating film 31. The polysilicon 32 is formed to continue to a polysilicon gate interconnect 28 of the second CMOS inverter circuit of FIG. 17.

Figure 19A:
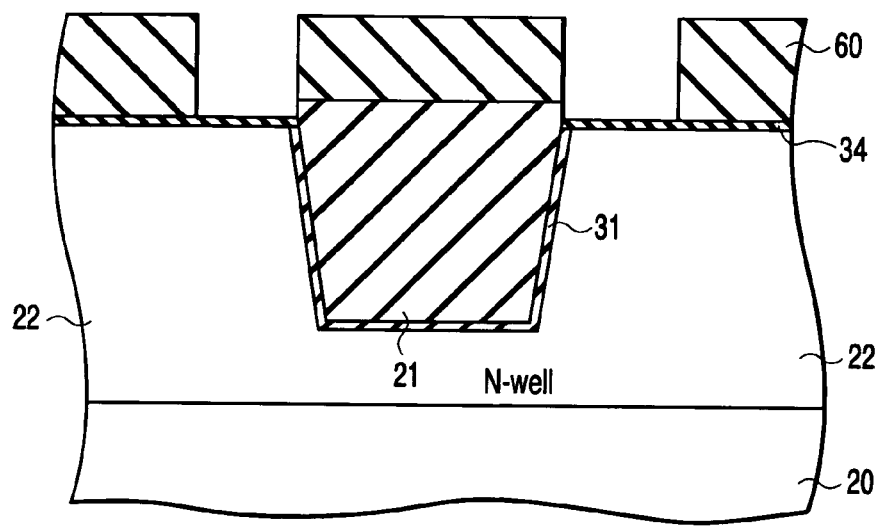
FIGS. 19A and 19B are cross-sectional views successively showing the process of manufacturing the cell array shown in FIG. 17.
Figure 19B:
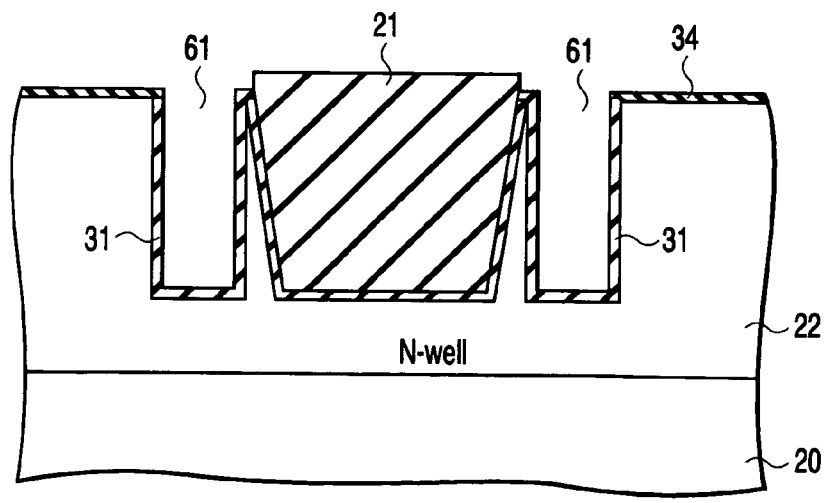

The process of manufacturing the SRAM of the eighth embodiment is substantially the same as the first embodiment. More specifically, as shown in FIG. 19A, STI region 21, N-well 22, P-well 23 and channel region are formed. Thereafter, resist is coated, and a resist pattern 60 is formed to form an opening at the position corresponding to the capacitor forming position, that is, the active area of the distal portion of the active area of the PMOS transistor. Using the resist pattern 60, the Si substrate 20 is etched under the etching condition having sufficient selectivity with respect to the oxide film of the STI region 21, as illustrated in FIG. 19B. In this case, the etching depth is arbitrary. However, in order to increase the capacitor area, the insulating film and the oxide film 39 may be deeply etched and removed by the bottom of the STI region 21. The etching depth may be set to the height position of about 100 nm from the bottom of the STI region 21 so that a parasitic transistor is not formed.

The process described so far is carried out, and thereby, a recess 61 is formed at the distal portion of the active region of the PMOS transistor. When the sidewall of the STI region 21 at the distal portion of the active region of the PMOS transistor is inclined, there is the possibility described below. That is, part of the active area remains between the sidewall of the STI region 21 and the recess 61; however, this is no problem. Thereafter, the resist pattern 60 is removed, and then, gate oxidization is carried out, and thereby, thin capacitor insulating film 31 is formed in the inner surface of the recess.

Thereafter, in order to form the gate electrode of the MOS transistor, gate interconnects and capacitor electrode, polysilicon 32 is deposited so that the recess is filled. The polysilicon is patterned, and the gate electrode, gate interconnects and capacitor electrode are formed as seen depicted in FIG. 18.

The SRAM device of the eighth embodiment has the same effect as that of the first embodiment. That is, the first and second capacitors are formed so that they are connected between the input nodes of the first and second CMOS inverter circuit and the N-well 22. In this way, it is possible to increase the charge stored by the SRAM cell itself, and to reduce soft error.

In the process of manufacturing the SRAM device of the eighth embodiment, the resist pattern may be formed in the following manner. More specifically, two openings of the resist pattern 60 shown in FIG. 19A are made into one opening. In other words, the resist pattern is formed to have one opening common to two capacitor forming positions. In this way, the resist pattern size is made larger than the case where the recess is formed for each capacitor forming position like the process of manufacturing the SRAM device of the first embodiment. Thus, the lithography process is readily carried out.

<Ninth Embodiment>

FIG. 20 schematically shows the sectional structure of the portion forming a first capacitor C1 of an SRAM device of the ninth embodiment.

The capacitor forming portion of the ninth embodiment differs from that of the eighth embodiment in the following point. More specifically, a recess is formed in the slightly front of the distal portion of the active region of the PMOS transistor. In other words, the recess is formed so that part of the active area is left between the STI region 21 and the recess. The first capacitor C1 is formed to increase the contact area between the capacitor insulating film 31 formed in the recess and the N-well 22. In this way, a larger capacitance is obtained. Other configuration is the same as the eighth embodiment. The second capacitor C2 is formed in the same manner as the first capacitor C1.

The process of manufacturing the SRAM device of the ninth embodiment is substantially the same as the eighth embodiment. In this case, when the STI region is formed, the sidewall of the trench is etched so that it is tapered in order to widen the opening surface of trench more than the bottom surface thereof. Then, a resist pattern is formed on part of the active area at the capacitor forming position, and the Si substrate 20 is etched. The process described so far is carried out, and thereby, the recess is formed at the slightly front side from the distal portion of the active region of the PMOS transistor.

Thereafter, the resist pattern is removed, and gate oxidization is carried out, and thereby, the inner surface of the recess is formed with a thin capacitor insulating film 31. In order to form the gate electrode of the MOS transistor, gate interconnects and capacitor electrode, polysilicon 32 is deposited so that it is filled in the recess. Thereafter, the polysilicon 32 is patterned to form the foregoing gate electrode, gate interconnects and capacitor electrode.

<Tenth Embodiment>

Figure 21:
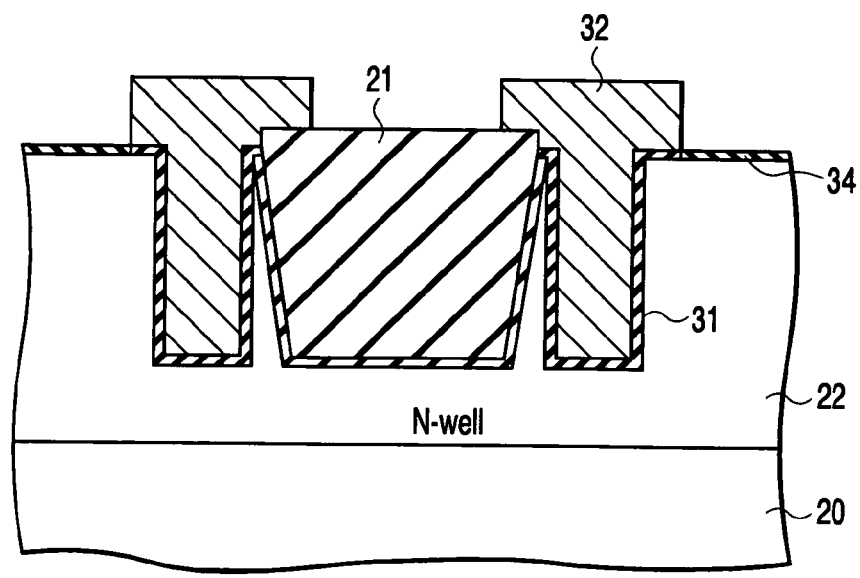
FIG. 21 is a cross-sectional view showing an SRAM cell array according to a tenth embodiment of the present invention.
Figure 22:
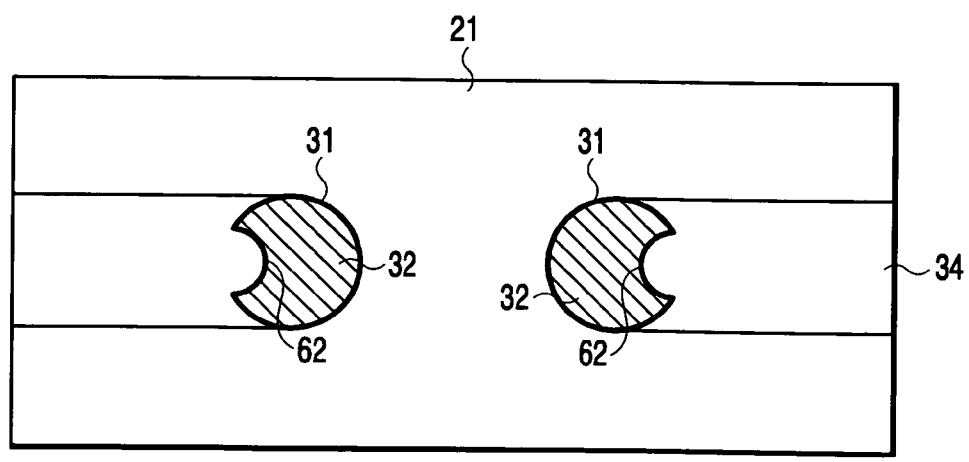
FIG. 22 is a top plan view schematically showing the planer pattern of the cell array shown in FIG. 21.

FIG. 21 schematically shows the sectional structure of a capacitor forming portion of an SRAM device according to the tenth embodiment. FIG. 22 schematically shows the planer pattern on the substrate surface with respect to the capacitor forming portion shown in FIG. 21 and its peripheral portions.

The SRAM device of the tenth embodiment shown in FIG. 21 and FIG. 22 differs from the foregoing eighth and ninth embodiments in the following point. More specifically, a capacitor forming recess is formed at the distal portion of the active region of the PMOS transistor. In this case, the inner surface of the recess is formed with a convex portion 62. Thereafter, the inner surface of the recess is formed with a capacitor insulating film 31 and capacitor electrode, for example, a polysilicon electrode 32. In this way, the contact area between N-well or P-well and the capacitor electrode is increased by the convex portion. Thus, the first and second capacitors C1 and C2 have a larger capacitance.

Figure 23:
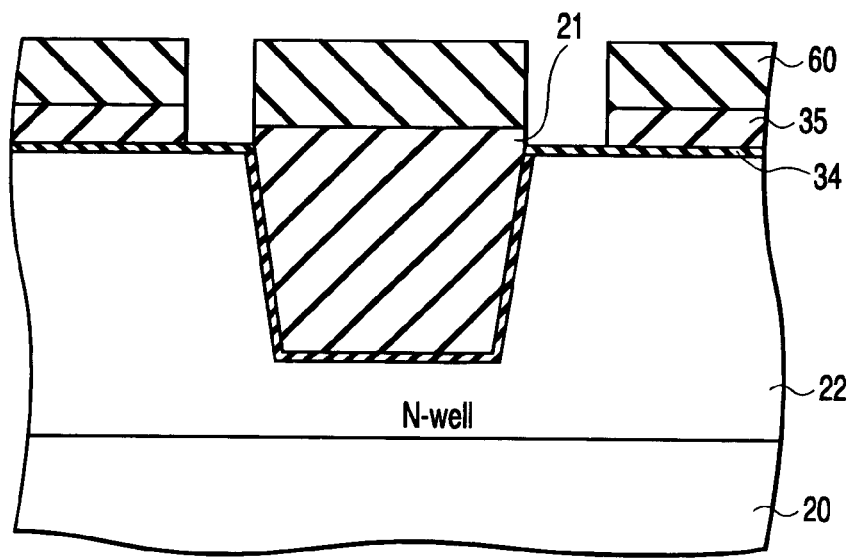
FIG. 23 is a cross-sectional view showing a cell array of an SRAM device according to a tenth embodiment of the present invention.
Figure 24:
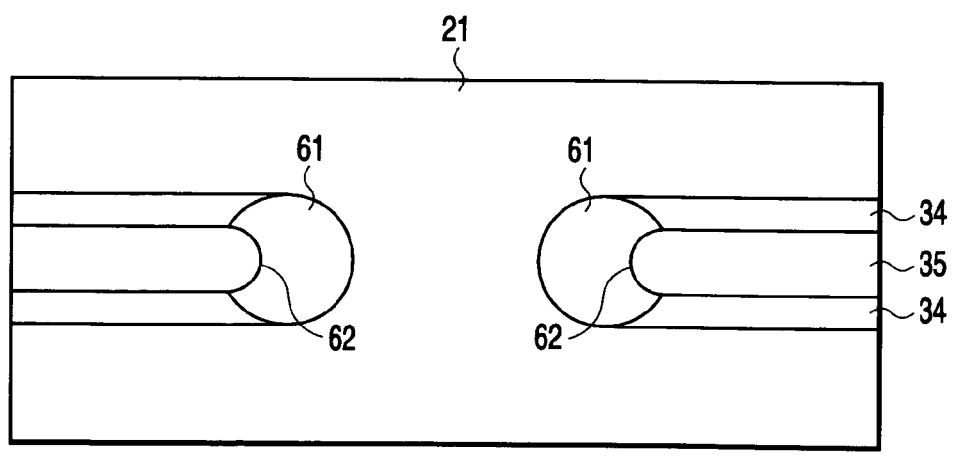
FIG. 24 is a top plan view schematically showing the planer pattern of the cell array shown in FIG. 23.

The process of manufacturing the SRAM device of the tenth embodiment is substantially the same as that of the foregoing eighth and ninth embodiments. More specifically, as shown in FIG. 23, the insulating film of the STI region 21 is deposited. Thereafter, a pad SiN film 35 is previously deposited as a mask material. Using the pad SiN film 35 as a stopper, the insulating film of the STI region 21 is polished by the CMP technique so that the STI region is formed. The STI region 21 is further etched by wet etching so that the insulating film of the STI region 21 is controlled lower in its height. Thereafter, as seen from the planer pattern of FIG. 24, the pad SiN film 35 is separated slightly from the peripheral edge on the active area to cover the center portion on the active area.

As depicted in FIG. 23, a resist pattern 60 is formed on part of the active area of the capacitor forming position to have an opening, and then, the Si substrate 20 is etched. The process described so far is carried out, and thereby, the recess is formed at the distal portion of the active region of the PMOS transistor. As seen from FIG. 24, the inner surface of the recess 61 is formed so that the portion corresponding to the bottom portion of the pad SiN film 35 protrudes. Therefore, the surface area of the inner surface of the recess 61 is increased.

Thereafter, the resist pattern 60 and the pad SiN film 35 are removed, and then, gate oxidization is carried out, and thereby, the inner surface of the recess is formed with a thin capacitor insulating film 31 as described in FIG. 21. As illustrated in FIG. 21, in order to form the gate electrode of the MOS transistor, gate interconnects and capacitor electrode, polysilicon 32 is deposited so that the recess is filled. Thereafter, the polysilicon 32 is patterned to form the gate electrode, the gate interconnects and the capacitor electrode.

In the tenth embodiment, a nitride film may be used as the capacitor insulating film 31 to increase the capacitance of the capacitors C1 and C2, like the foregoing third embodiment. In addition, metal may be used as the gate electrode, the gate interconnects and the capacitor electrode, like the foregoing fourth embodiment.

<11th Embodiment>

The 11th embodiment differs from the first embodiment in the forming position of the first and second capacitors C1 and C2.

Figure 25:
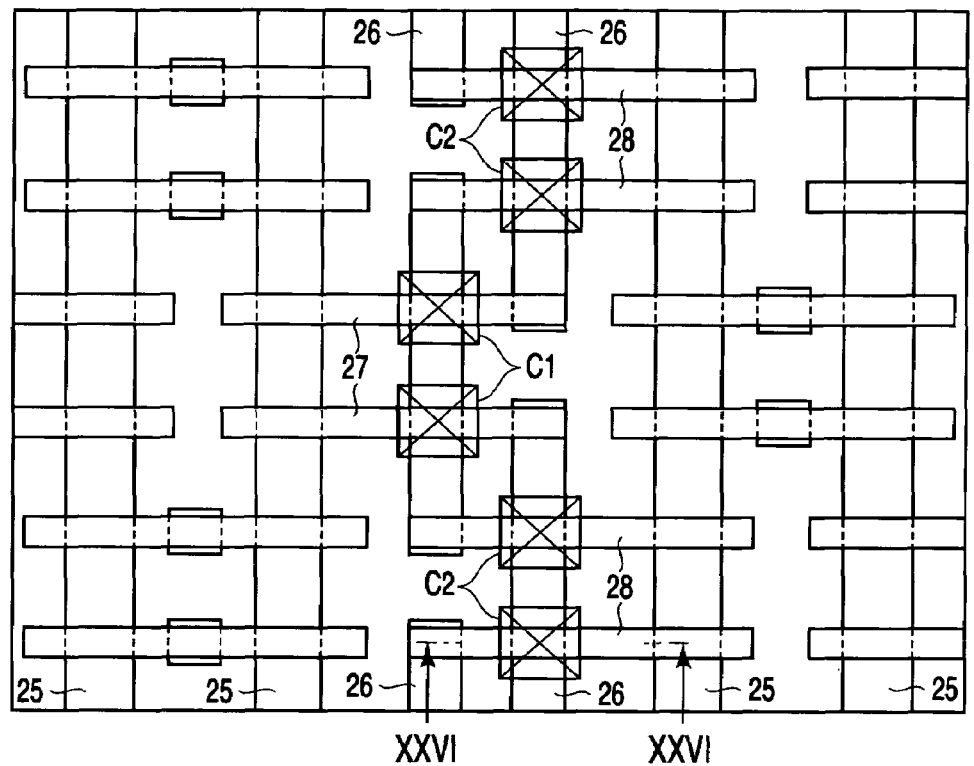
FIG. 25 is a top plan view showing the pattern layout of an SRAM cell array according to an 11th embodiment of the present invention.

FIG. 25 is a top plan view showing another example of the pattern layout of a cell array having matrix-like arrayed SRAM cells shown in FIG. 1 in the 11th embodiment. The pattern layout shown in FIG. 25 differs from that shown in the first embodiment of FIG. 2 in the forming position of the first and second capacitors C1 and C2. Other configuration is same as the first embodiment; therefore, the same reference numerals are used to designate portions identical to FIG. 2, and the details are omitted.

As seen from FIG. 25, the first capacitor C1 is formed facing each other on both sides of the active region in a state of crossing the first PMOS transistor QP1 in the cell region along the channel width direction (gate length direction). The second capacitor C2 is formed facing each other on both sides of the active region in a state of crossing the second PMOS transistor QP2 along the channel width direction (gate length direction).

As illustrated in the cross-sectional view of FIG. 26, the first capacitor C1 is formed in the following manner. The capacitor insulating film 31 is formed so that one side contacts with the N-well 22 in a recess formed in the STI region 21 on both sides in the channel width direction of the channel region 19 of the first PMOS transistor QP1. Polysilicon 32 is filled in the recess to contact with the other side of the capacitor insulating film 31. The polysilicon 32 is formed continuing to the gate interconnect 27 consisting of polysilicon of the first PMOS transistor QP1.

The second capacitor C2 is formed in the same manner as the first capacitor C1 shown in FIG. 25. More specifically, a recess is formed in the STI region 21 on both sides in the channel width direction of the channel region 19 of the second PMOS transistor QP2. The capacitor insulating film is formed so that one side contacts with the N-well 22 in the recess, and polysilicon is filled in the recess to contact with the other side of the capacitor insulating film. The polysilicon 32 is formed continuing to the gate interconnect 28 consisting of polysilicon of the second PMOS transistor QP2.

The process of manufacturing the SRAM device of the 11th embodiment is substantially the same as the first embodiment. More specifically, as shown in FIG. 26, STI region 21, N-well 22, P-well 23 and channel region 19 are formed. Thereafter, a resist is coated, and a resist pattern 60 is patterned to form an opening at the capacitor forming position, and thereby, a resist pattern is formed. In this case, the opening of the resist pattern includes each part STI regions 21 (one is well isolation STI region 21) on both sides on the active area (N-well 22) of the load PMOS transistor and the channel region of the load PMOS transistor.

The insulating film is etched using the resist pattern under the etching condition having sufficient selectivity with respect to the Si substrate, and thus, part of the insulating film in the STI region 21 is removed. Thereafter, the post-treatment of removing depositions generated in the foregoing etching is carried out, if necessary. The process described so far is carried out, and thereby, the recess is formed in each of STI regions 21 on both sides of the channel region 19 of the load PMOS transistor.

Thereafter, the resist pattern is removed, and then, gate oxidization is carried out. In this way, the thin capacitor insulating film 31 having a thickness of about several nm is formed in the recess inner surface of the STI region 21, that is, trench inner wall and on the upper surface of the channel region of the PMOS transistor adjacent thereto. Thereafter, in order to form the gate electrode of the MOS transistor, gate interconnects and capacitor electrode, a conductive material, that is, polysilicon 32 is deposited so that the recess 42 is filled with the polysilicon 32. Then, the polysilicon 32 is patterned, and thereby, the gate electrode, the gate interconnects and the capacitor electrode are formed.

The manufacturing process described above is carried out, and thereby, a capacitor having the capacitor insulating film 31 and the capacitor electrode consisting of the polysilicon 32 is formed. As described before, the capacitor insulating film 31 is formed so that its one side contacts with the N-well 22 in the recess formed in the STI region 21 on both sides of the channel region 19 of the PMOS transistor. The capacitor electrode consists of the polysilicon 32 filled in the recess so that it contacts with the other side of the capacitor insulating film 31.

In the manufacturing process, when STI regions 21 on both sides of the active region of the N-well 22 of the PMOS transistor and filled insulating film are etched, etching is carried out to reach by the bottom of the STI region 21. In this way, the capacitor area is largely secured. However, in this case, a parasitic transistor using polysilicon as the gate electrode is formed between the channel region 19 of the PMOS transistor and the P-well 23. For this reason, N-well 22 and P-well 23 must be optimally formed to prevent the failure of the operation of the SRAM device resulting from the formed parasitic transistor. In order to prevent the foregoing parasitic transistor from being formed when etching STI region 21 and insulating film filled therein, the etching depth is set as follows. More specifically, the etching depth is set to the height position H of about 100 nm from the bottom of the STI region 21.

In the SRAM cell of the 11th embodiment, SRAM cell having the STI structure, first and second capacitors are formed, and soft error is reduced, like the SRAM cell of the first embodiment. According to the 11th embodiment, the capacitor insulating film 31 and the capacitor electrode (polysilicon 32) are formed in the recess formed in the STI regions 21 on both sides on the active area of the load PMOS transistor. In other words, both side walls of the N-well 22 including the active area of the load PMOS transistor is formed with a capacitor. Therefore, the capacitance increases about two times as much as the SRAM cell according to the first embodiment. In addition, it is possible to secure an area for obtaining sufficient capacitance required for soft error immunity.

As shown in FIG. 25, the gate electrode is formed in a state of crossing the active area of the load PMOS transistor along the channel width direction. Therefore, the effective channel width of the load PMOS transistor is increased as seen from FIG. 26; as a result, channel conductance of the PMOS transistor is improved.

Figure 26:
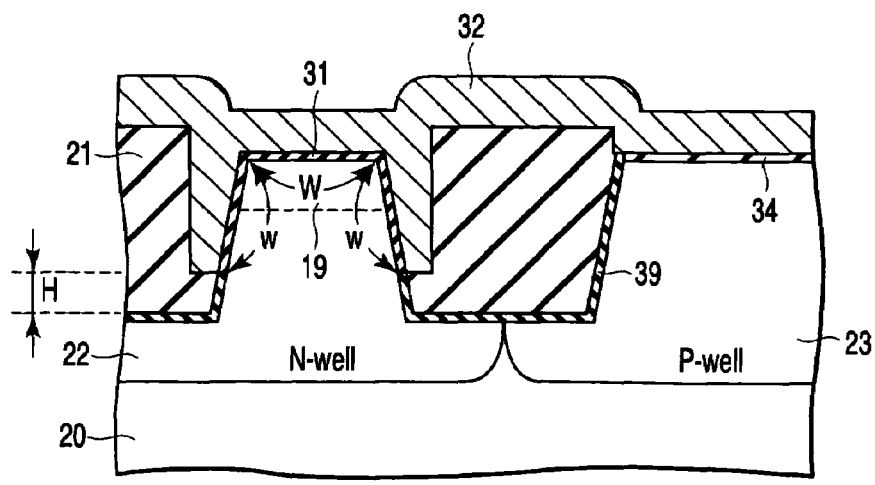
FIG. 26 is a cross-sectional view of the cell array shown in FIG. 25.

In FIG. 26, W denotes an inherent channel width of the load PMOS transistor; on the other hand, w is a channel width extended with added capacitor electrode (polysilicon 32). Thus, the effective channel width has the value (W+2w).

In the 11th embodiment, a nitride film may be used as the capacitor insulating film to increase the capacitance, like the third embodiment. In addition, metal may be used as the gate electrode, the gate interconnect and the capacitor electrode.

<12th Embodiment>

The 12th embodiment differs from the seventh embodiment in the forming position of the first and second capacitors C1 and C2.

Figure 27:
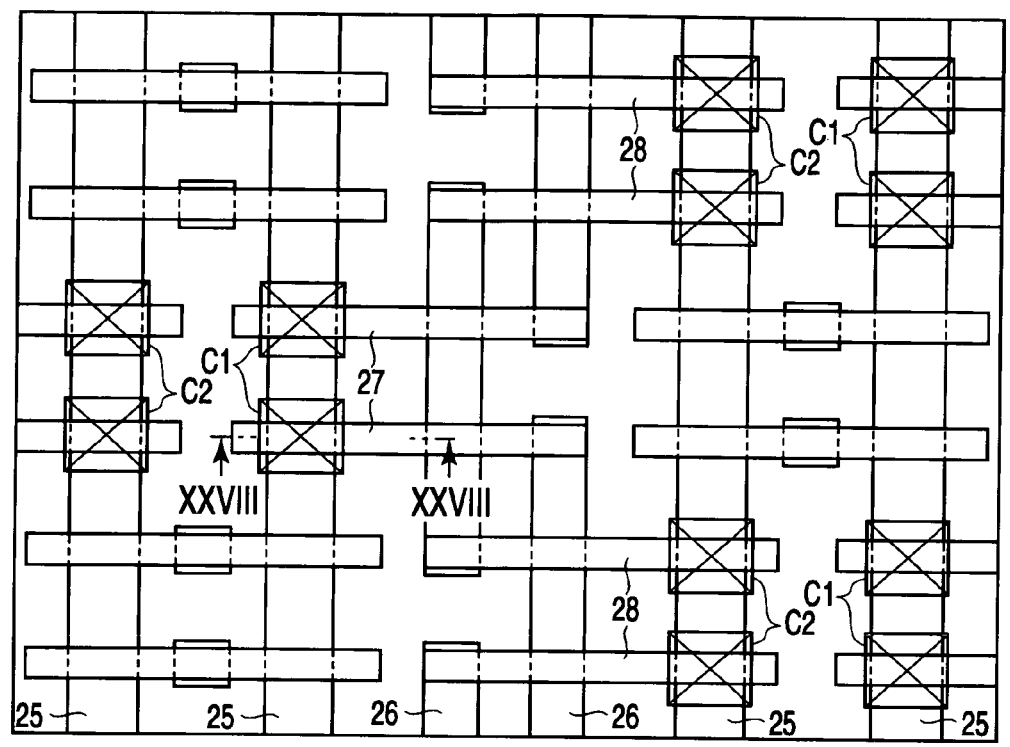
FIG. 27 is a top plan view showing the pattern layout of an SRAM cell array according to a 12th embodiment of the present invention.

FIG. 27 is a top plan view showing another example of the pattern layout of a cell array having matrix-like arrayed SRAM cells shown in FIG. 14 in the 12th embodiment. The pattern layout shown in FIG. 27 differs from that shown in the seventh embodiment of FIG. 14 in the forming position of the first and second capacitors C1 and C2. Other configuration is the same as the first embodiment; therefore, the same reference numerals are used to designate portions identical to FIG. 15, and the details are omitted.

As seen from FIG. 27, the first capacitor C1 is formed facing each other on both sides of the active region in a state of crossing the first NMOS transistor QN1 in the cell region along the channel width direction (gate length direction). The second capacitor C2 is formed facing each other on both sides of the active region in a state of crossing the second NMOS transistor QN2 along the channel width direction (gate length direction).

Figure 28:
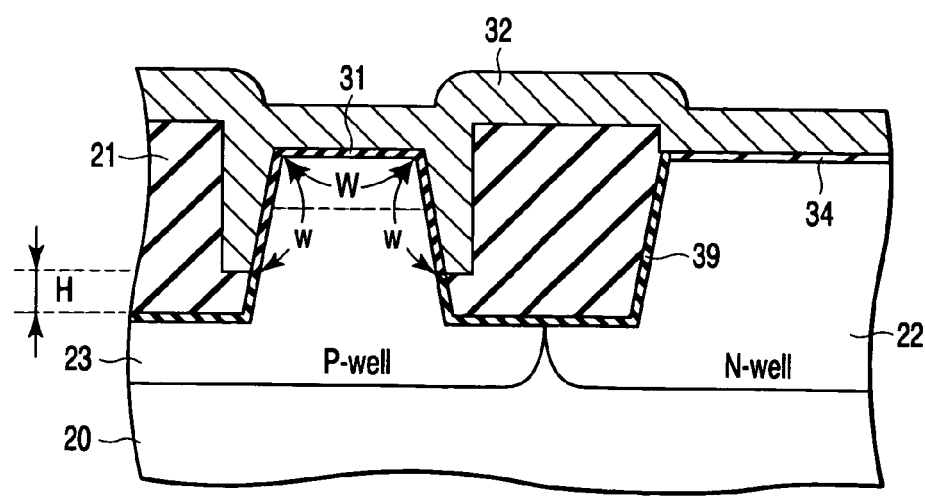
FIG. 28 is a cross-sectional view of the cell array shown in FIG. 27.

As illustrated in FIG. 28, the first capacitor C1 is formed in the following manner. The capacitor insulating film 31 is formed so that one side contacts with the P-well 23 in each recess formed in the STI region 21 on both sides in the channel width direction of the active region of the first NMOS transistor QN1. Polysilicon 32 is filled in the recess to contact with the other side of the capacitor insulating film 31. The polysilicon 32 is formed continuing to the gate interconnect 27 consisting of polysilicon of the first NMOS transistor QN1.

The second capacitor C2 is formed in the same manner-as the foregoing first capacitor C1. More specifically, a recess is formed in the STI region 21 on both sides in the channel width direction of the active region of the second NMOS transistor QN2. The capacitor insulating film 31 is formed so that one side contacts with the P-well 23 in the recess, and polysilicon 32 is filled in the recess to contact with the other side of the capacitor insulating film. The polysilicon 32 is formed continuing to the gate interconnect 28 consisting of polysilicon of the second NMOS transistor QN2.

The process of manufacturing the SRAM device of the 12th embodiment is substantially the same as the first embodiment. More specifically, as shown in FIG. 28, STI region 21, N-well 22, P-well 23 and channel region 19 are formed. Thereafter, resist is coated, and a resist pattern is patterned to form an opening at the capacitor forming position, and thereby, a resist pattern is formed. In this case, the opening of the resist pattern includes each part STI regions 21 (one is well isolation STI region 21) on both sides on the active area (P-well 23) of the driver NMOS transistor and the channel region of the driver NMOS transistor.

Then, the insulating film is etched using the resist pattern under the etching condition having sufficient selectivity with respect to the Si substrate, and thus, part of the insulating film in the STI region 21 is removed. Thereafter, the post-treatment of removing depositions generated in the foregoing etching is carried out, if necessary. The process described so far is carried out, and thereby, the recess is formed in each of STI regions 21 on both sides of the active region of the driver NMOS transistor.

Thereafter, the resist pattern is removed, and then, oxidization is carried out. In this way, the thin capacitor insulating film 31 having a thickness of about several nm is formed in the recess inner surface of the STI region 21, that is, trench inner wall and on the upper surface of the channel area of the driver NMOS transistor adjacent thereto. Thereafter, in order to form the gate electrode of the MOS transistor, gate interconnects and capacitor electrode, a conductive material, that is, polysilicon 32 is deposited so that the recess is filled with the polysilicon 32. Then, the polysilicon 32 is patterned, and thereby, the gate electrode, the gate interconnects and the capacitor electrode are formed.

The manufacturing process described above is carried out, and thereby, a capacitor having the capacitor insulating film 31 and the capacitor electrode consisting of the polysilicon 32 is formed. As described before, the capacitor insulating film 31 is formed so that its one side contacts with the P-well 23 in the recess formed in the STI region 21 on both sides of active area of the driver NMOS transistor. The capacitor electrode consists of the polysilicon 32 filled in the recess so that it contacts with the other side of the capacitor insulating film 31.

In the manufacturing process, when part of the insulating film of the STI regions 21 on both sides of the active region of the P-well 23 including the active area of the driver NMOS transistor is etched, etching is deeply carried out to reach by the bottom of the STI region 21. In this way, the capacitor area is largely secured. However, in this case, a parasitic transistor using polysilicon as the gate electrode is formed between the channel region 19 of the NMOS transistor and the N-well 22. For this reason, N-well 22 and P-well 23 must be optimally formed to prevent the failure of the operation of the SRAM device resulting from the formed parasitic transistor. In order to prevent the foregoing parasitic transistor from being formed when etching STI region 21 and insulating film filled therein, the etching depth is set as follows. More specifically, the etching depth is set to the height position H of about 100 nm from the bottom of the STI region 21.

In the SRAM cell of the 12th embodiment, SRAM cell having the STI structure, first and second capacitors are formed, and soft error is reduced, like the SRAM cell of the seventh embodiment. According to the 12th embodiment, the capacitor insulating film 31 and the capacitor electrode (polysilicon 32) are formed in the recess formed in the STI regions 21 on both sides of the P-well 23 including the active area of the driver NMOS transistor. In other words, both side walls of the P-well 23 including the active area of the driver NMOS transistor is formed with a capacitor. Therefore, the capacitance increases about two times as much as the SRAM cell according to the seventh embodiment. In addition, it is possible to secure an area for obtaining sufficient capacitance required for soft error immunity.

As shown in FIG. 28, the gate electrode is formed in a state of crossing the active area of the driver NMOS transistor along the channel width direction. Therefore, the effective channel width of the driver NMOS transistor is increased, that is, (W+2w), like the 11th embodiment; as a result, channel conductance of the NMOS transistor is improved.

In the 12th embodiment, a nitride film may be used as the capacitor insulating film to increase the capacitance, like the third embodiment. In addition, metal may be used as gate electrode, gate interconnect and capacitor electrode.

<13th Embodiment>

Figure 29:
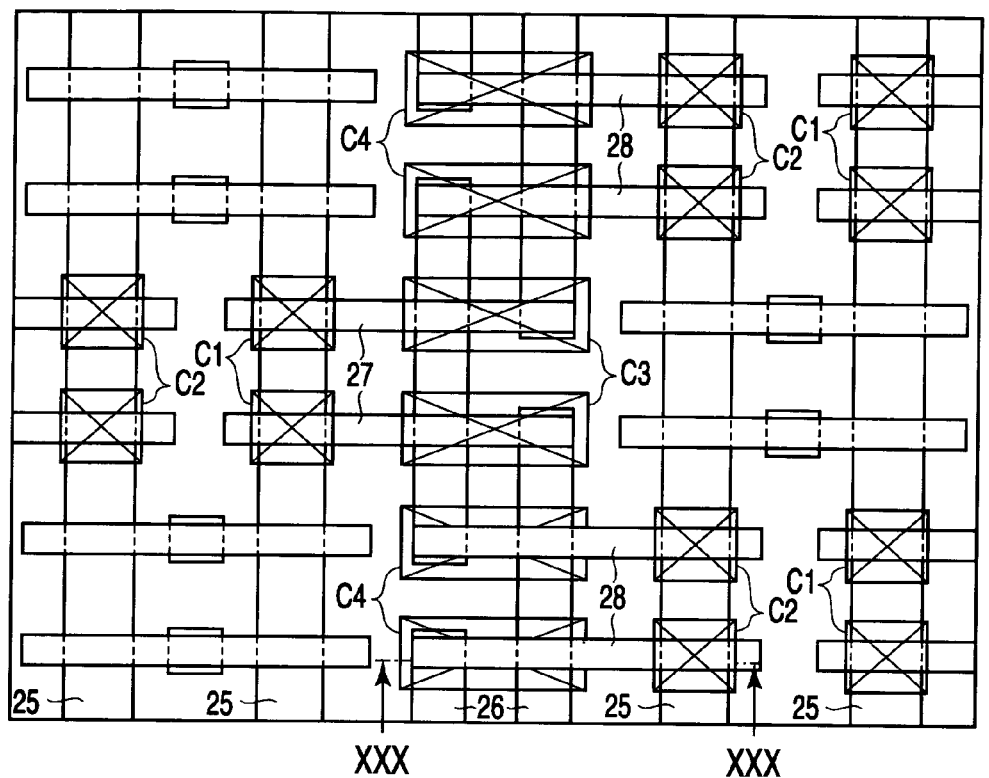
FIG. 29 is a top plan view showing the pattern layout of an SRAM cell array according to a 13th embodiment of the present invention.

The 13th embodiment differs from the fifth embodiment in the forming position of first and second capacitors C1 and C2. FIG. 29 is a top plan view showing another example of the pattern layout of a cell array having matrix-like arrayed SRAM cells shown in FIG. 9. The pattern layout shown in FIG. 29 differs from that shown in the seventh embodiment of FIG. 10 in the forming position of the first and second capacitors C1 and C2. Other configuration is the same as the fifth embodiment; therefore, the same reference numerals are used to designate portions identical to FIG. 10, and the details are omitted.

As seen from FIG. 29, the first capacitor C1 includes three parts, which are discretely formed. More specifically, the first part faces each other on both sides of the active region (P-well 23) in a state of crossing the first NMOS transistor QN1 in the cell region along the channel width direction (gate length direction). The second part faces each other on both sides of the active region (N-well 22) in a state of crossing the first PMOS transistor QP1 in the cell region along the channel width direction (gate length direction). The third part is formed in the STI region 21 adjacent to the drain region (N-well 22) of the first PMOS transistor QP1.

Figure 30:
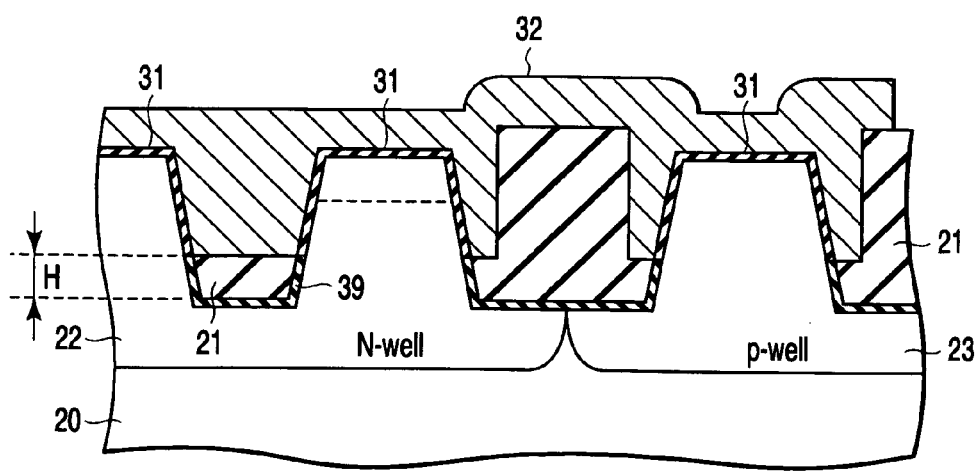
FIG. 30 is a cross-sectional view of the cell array shown in FIG. 29.

As shown in FIG. 30, in the first part, the capacitor insulating film 31 is formed so that its one side contacts with the P-well 23 in a recess formed in the STI region 21 on both sides of the active region of the driver NMOS transistor, like the 12th embodiment shown in FIG. 28. In this case, the recess is formed so that it is etched by the height position H of about 100 nm from the bottom of the STI region 21.

In the second part, the capacitor insulating film 31 is formed so that its one side contacts with the N-well 22 in a recess formed in the STI region 21 on both sides of the active region of the load PMOS transistor, like the 11th embodiment shown in FIG. 26. In this case, the recess is formed so that it is etched by the height position H of about 100 nm from the bottom of the STI region 21.

In the third part, the capacitor insulating film 31 is formed so that its one side contacts with the N-well 22 in the recess formed in the STI region 21, like the first embodiment shown in FIG. 2. In this case, the third part is adjacent on the same N-well 22 as the second part. In the STI region existing between the second and third parts, the recess is formed having the height position H of about 100 nm from the bottom of the STI region 21.

A conductor, that is, polysilicon 32 is deposited in each recess to contact with the other side of each capacitor insulating films 31 of the first to third parts, and thereby, a capacitor electrode is formed. The polysilicon 32 forms each gate electrode of first PMOS and NMOS transistors QP1, QN1 and gate interconnects.

As seen from FIG. 29, the second capacitor C2 includes fourth to sixth parts, which are discretely formed. More specifically, the fourth part faces each other on both sides of the active region (in P-well 23) in a state of crossing the second NMOS transistor QN2 in the cell region along the channel width direction. The fifth part faces each other on both sides of the active region (in N-well 22) in a state of crossing the second PMOS transistor QP2 in the cell region along the channel width direction. The sixth part is formed in the STI region 21 adjacent to the drain region (in N-well 22) of the second PMOS transistor QP2.

In the fourth part, the capacitor insulating film 31 is formed so that its one side contacts with the P-well 23 in a recess formed in the STI region 21 on both sides of the active region of the driver NMOS transistor, like the 12th embodiment shown in FIG. 28. In this case, the recess is formed so that it is etched by the height position H of about 100 nm from the bottom of the STI region 21.

In the fifth part, the capacitor insulating film 31 is formed so that its one side contacts with the N-well 22 in a recess formed in the STI region 21 on both sides of the active region of the load PMOS transistor, like the 11th embodiment shown in FIG. 26. In this case, the recess is formed so that it is etched by the height position H of about 100 nm from the bottom of the STI region 21.

In the sixth part, the capacitor insulating film 31 is formed so that its one side contacts with the N-well 22 in the recess formed in the STI region 21, like the first embodiment shown in FIG. 2. In this case, the sixth part is adjacent on the same N-well 22 as the fifth part. In the STI region existing between the fifth and sixth parts, the recess is formed having the height position H of about 100 nm from the bottom of the STI region 21.

A conductor, that is, polysilicon 32 is deposited in each recess to contact with the other side of each capacitor insulating films 31 of the fourth to sixth parts, and thereby, a capacitor electrode is formed. The polysilicon 32 forms each gate electrode of second PMOS and NMOS transistors QP2, QN2 and gate interconnects.

In the SRAM cell of the 13th embodiment, SRAM cell having the STI structure, first and second capacitors are formed, and soft error is reduced, like the SRAM cell of the first embodiment. According to the 13th embodiment, the capacitor insulating film 31 and the capacitor electrode (polysilicon 32) are formed in the recess formed in the STI regions 21 on both sides of the P-well 23 including the active area of the driver NMOS transistor. The capacitor insulating film 31 and the capacitor electrode (polysilicon 32) are formed in the recess formed in the STI regions 21 on both sides of the P-well 23 including the active area of the load PMOS transistor, like the SRAM cell of the 11th embodiment. The capacitor insulating film 31 and the capacitor electrode (polysilicon 32) are formed in the recess formed in the STI regions 21 adjacent to the drain region of the load PMOS transistor, like the SRAM cell of the first embodiment. Therefore, it is possible to further secure the area for obtaining a sufficient capacitance required for soft error immunity as the capacitor as compared with each SRAM cell of the first to 12th embodiments. In addition, the gate electrode is formed in a state of crossing the active area of driver NMOS and load PMOS transistors in the gate length direction (channel width direction). Therefore, the effective channel width of the MOS transistor is increased, and channel conductance is further improved.

In the 13th embodiment, a nitride film may be used as the capacitor insulating film to increase the capacitance, like the third embodiment. In addition, metal may be used as gate electrode, gate interconnect and capacitor electrode.

According to the present invention, the first to 13th embodiments may be arbitrarily combined in order to obtain the capacitance required for soft error immunity in the SRAM device. In this case, when the 11th to 13th embodiments are applied, the well must be optimized and the depth of the recess must be carefully set so that a parasitic transistor is not formed.

The foregoing embodiments have described the SRAM device. The present invention is applicable to a semiconductor integrated circuit mounted with such as SRAM embedded logic integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
an N-well and a P-well formed in a semiconductor substrate, and isolated from each other with a plurality of isolation regions each having a trench structure;
a first CMOS inverter circuit including a first P-channel MOS transistor, which has a gate electrode, a source region, a drain region and a channel region, and is formed on the N-well, and a first N-channel MOS transistor, which has a gate electrode connected common to the gate electrode of the first P-channel MOS transistor, a source region, a drain region connected common to the drain region of the first P-channel MOS transistor and a channel region, and is formed on the P-well;
a second CMOS inverter circuit including a second P-channel MOS transistor, which has a gate electrode, a source region, a drain region and a channel region, and is formed on the N-well, and a second N-channel MOS transistor, which has a gate electrode connected common to the gate electrode of the second P-channel MOS transistor, a source region, a drain region connected common to the drain region of the second P-channel MOS transistor and a channel region, and is formed on the P-well, the second CMOS inverter circuit forming a static memory cell together with the first CMOS inverter circuit;
a first capacitor connected between a gate electrode common connection node of the first P-channel and N-channel MOS transistors and one of the N-well and the P-well; and
a second capacitor connected between a gate electrode common connection node of the second P-channel and N-channel MOS transistors and one of the N-well and the P-well.

2. The device according to claim 1, wherein the first capacitor includes:

a first capacitor insulating film formed on an inner surface of a first recess formed in one of the plurality of isolation regions which is adjacent to the drain region of the second P-channel MOS transistor to contact with the N-well; and
a first electrode formed in the first recess, and electrically connected to the gate electrode of the first P-channel MOS transistor, and
the second capacitor includes:
a second capacitor insulating film formed on an inner surface of a second recess formed in another one of the plurality of isolation regions which is adjacent to the drain region of the first P-channel MOS transistor to contact with the N-well; and
a second electrode formed in the second recess, and electrically connected to the gate electrode of the second P-channel MOS transistor.

3. The device according to claim 1, wherein the first capacitor includes:
a first capacitor insulating film formed on an inner surface of a first recess formed in one of the plurality of isolation regions which is adjacent to the drain region of the second N-channel MOS transistor to contact with the P-well; and
a first electrode formed in the first recess, and electrically connected to the gate electrode of the first N-channel MOS transistor, and
the second capacitor includes:
a second capacitor insulating film formed on an inner surface of a second recess formed in another one of the plurality of isolation regions which is adjacent to the drain region of the first N-channel MOS transistor to contact with the P-well; and
a second electrode formed in the second recess, and electrically connected to the gate electrode of the second N-channel MOS transistor.

4. The device according to claim 1, wherein the first capacitor includes:
a first capacitor insulating film formed on an inner surface of a first recess formed in the drain region of the second P-channel MOS transistor to contact with the N-well; and
a first electrode formed in the first recess, and electrically connected to the gate electrode of the first P-channel MOS transistor, and
the second capacitor includes:
a second capacitor insulating film formed on an inner surface of a second recess formed in the drain region of the first P-channel MOS transistor to contact with the N-well; and
a second electrode formed in the second recess, and electrically connected to the gate electrode of the second P-channel MOS transistor.

5. The device according to claim 1, wherein the first capacitor includes:
a first capacitor insulating film formed on an inner surface of a first recess formed in the drain region of the second N-channel MOS transistor to contact with the P-well; and
a first electrode formed in the first recess, and electrically connected to the gate electrode of the first N-channel MOS transistor, and
the second capacitor includes:
a second capacitor insulating film formed on an inner surface of a second recess formed in the drain region of the first N-channel MOS transistor to contact with the P-well; and
a second electrode formed in the second recess, and electrically connected to the gate electrode of the second N-channel MOS transistor.

6. The device according to claim 1, wherein the first capacitor includes:
a first capacitor insulating film formed on an inner surface of a first recess formed in each of two isolation regions positioned on both sides of the channel region of the second P-channel MOS transistor to contact with the N-well; and
a first electrode buried in the first recess while being formed in a state of crossing the channel region of the second P-channel MOS transistor, and electrically connected to the gate electrode of the second P-channel MOS transistor, and
the second capacitor includes:
a second capacitor insulating film formed on an inner surface of a second recess formed in each of two isolation regions positioned on both sides of the channel region of the first P-channel MOS transistor to contact with the N-well; and
a second electrode buried in the second recess while being formed in a state of crossing the channel region of the first P-channel MOS transistor, and electrically connected to the gate electrode of the first P-channel MOS transistor.

7. The device according to claim 6, wherein each the bottom of the first and second recesses is positioned higher than the bottom of the trench of the isolation region.

8. The device according to claim 1, wherein the first capacitor includes:
a first capacitor insulating film formed on an inner surface of a first recess formed in each of two isolation regions positioned on both sides of the channel region of the second N-channel MOS transistor to contact with the P-well; and
a first electrode buried in the first recess while being formed in a state of crossing the channel region of the second N-channel MOS transistor, and electrically connected to the gate electrode of the second N-channel MOS transistor, and
the second capacitor includes:
a second capacitor insulating film formed on an inner surface of a second recess formed in each of two isolation regions positioned on both sides of the channel region of the first N-channel MOS transistor to contact with the P-well; and
a second electrode buried in the second recess while being formed in a state of crossing the channel region of the first N-channel MOS transistor, and electrically connected to the gate electrode of the first N-channel MOS transistor.

9. The device according to claim 8, wherein each the bottom of the first and second recesses is positioned higher than the bottom of the trench of the isolation region.

10. The device according to claim 1, wherein the N-well is fixed to a first voltage while the P-well is fixed to a second voltage.

11. The device according to claim 1, further comprising:
a third capacitor connected between a gate electrode common connection node of the first P-channel and N-channel MOS transistors and the other of the N-well and the P-well; and
a fourth capacitor connected between a gate electrode common connection node of the second P-channel and N-channel MOS transistors and the other of the N-well and the P-well.

12. A semiconductor memory device comprising:
- an N-well and a first and a second P-wells formed in a semiconductor substrate, and isolated from each other with a plurality of isolation regions each having a trench structure;
- a first CMOS inverter circuit including a first P-channel MOS transistor, which has a gate electrode, a source region, a drain region and a channel region, and is formed on the N-well, and a first N-channel MOS transistor, which has a gate electrode connected common to the gate electrode of the first P-channel MOS transistor, a source region, a drain region connected common to the drain region of the first P-channel MOS transistor and a channel region, and is formed on the first P-well;
- a second CMOS inverter circuit including a second P-channel MOS transistor, which has a gate electrode, a source region, a drain region and a channel region, and is formed on the N-well, and a second N-channel MOS transistor, which has a gate electrode connected common to the gate electrode of the second N-channel MOS transistor, a source region, a drain region connected common to the drain region of the second P-channel MOS transistor and a channel region, and is formed on the second P-well, the second CMOS inverter circuit forming a static memory cell together with the first CMOS inverter circuit;
- a first capacitor connected between a gate electrode common connection node of the first P-channel and N-channel MOS transistors and the N-well; and
- a second capacitor connected between a gate electrode common connection node of the second P-channel and N-channel MOS transistors and the N-well.

13. The device according to claim 12, wherein the first capacitor includes:
- a first capacitor insulating film formed on an inner surface of a first recess formed in one of the plurality of isolation regions which is adjacent to the drain region of the second P-channel MOS transistor to contact with the N-well; and
- a first electrode formed in the first recess, and electrically connected to the gate electrode of the first P-channel MOS transistor, and the second capacitor includes:
- a second capacitor insulating film formed on an inner surface of a second recess formed in another one of the plurality of isolation regions which is adjacent to the drain region of the first P-channel MOS transistor to contact with the N-well; and
- a second electrode formed in the second recess, and electrically connected to the gate electrode of the second P-channel MOS transistor.

14. The device according to claim 12, wherein the N-well is fixed to a first voltage while each of the first and second P-well is fixed to a second voltage.

15. The device according to claim 13, wherein each of the first and second capacitor insulating films is a silicon nitride film.

16. The device according to claim 13, wherein gate electrodes of the first and second P-channel MOS transistors, gate electrodes of the first and second N-channel MOS transistors, the first and second electrodes each consist of metal.

17. A semiconductor memory device comprising:
- an N-well and a first and a second P-wells formed in a semiconductor substrate, and isolated from each other with a plurality of isolation regions each having a trench structure;
- a first CMOS inverter circuit including a first P-channel MOS transistor, which has a gate electrode, a source region, a drain region and a channel region, and is formed on the N-well, and a first N-channel MOS transistor, which has a gate electrode connected common to the gate electrode of the first P-channel MOS transistor, a source region, a drain region connected common to the drain region of the first P-channel MOS transistor and a channel region, and is formed on the first P-well;
- a second CMOS inverter circuit including a second P-channel MOS transistor, which has a gate electrode, a source region, a drain region and a channel region, and is formed on the N-well, and a second N-channel MOS transistor, which has a gate electrode connected common to the gate electrode of the second P-channel MOS transistor, a source region, a drain region connected common to the drain region of the second P-channel MOS transistor and a channel region, and is formed on the second P-well, the second CMOS inverter circuit forming a static memory cell together with the first CMOS inverter circuit;
- a first capacitor connected between a gate electrode common connection node of the first P-channel and N-channel MOS transistors and the N-well;
- a second capacitor connected between a gate electrode common connection node of the second P-channel and N-channel MOS transistors and the N-well;
- a third capacitor connected between a gate electrode common connection node of the first P-channel and N-channel MOS transistors and the first P-well; and
- a fourth capacitor connected between a gate electrode common connection node of the second P-channel and N-channel MOS transistors and the second P-well.

18. The device according to claim 17, wherein the first and second capacitors each include:
- a first capacitor insulating film formed on an inner wall of a first recess formed in the isolation region interposed between the N-well and the first P-well to contact with both the N-well and the first P-well; and
- a first electrode formed in the first recess, and the third and fourth capacitors each include:
- a second capacitor insulating film formed on an inner wall of a second recess formed in the isolation region interposed between the N-well and the second P-well to contact with both the N-well and the first P-well; and
- a second electrode formed in the second recess.

19. The device according to claim 17, wherein the N-well is fixed to a first voltage while each of the first and second P-well is fixed to a second voltage.

20. The device according to claim 18, wherein each of the first and second capacitor insulating films is a silicon nitride film.

* * * * *